(12) United States Patent
Eller et al.

(10) Patent No.: US 11,903,320 B2
(45) Date of Patent: Feb. 13, 2024

(54) METHOD FOR APPLYING AT LEAST ONE SILICONE LAYER BY LASER TRANSFER PRINTING

(71) Applicant: WACKER CHEMIE AG, Munich (DE)

(72) Inventors: Klaus Eller, Burghausen (DE); Andreas Koellnberger, Kirchdorf (DE); Johannes Neuwirth, Oberndorf (AT)

(73) Assignee: Wacker Chemie AG, Munich (DE)

( * ) Notice: Subject to any disclaimer, the term of this patent is extended or adjusted under 35 U.S.C. 154(b) by 812 days.

(21) Appl. No.: 17/041,249

(22) PCT Filed: Jan. 28, 2019

(86) PCT No.: PCT/EP2019/052019
§ 371 (c)(1),
(2) Date: Sep. 24, 2020

(87) PCT Pub. No.: WO2020/156632
PCT Pub. Date: Aug. 6, 2020

(65) Prior Publication Data
US 2021/0367140 A1    Nov. 25, 2021

(51) Int. Cl.
| | |
|---|---|
| *B05D 1/00* | (2006.01) |
| *H10N 30/098* | (2023.01) |
| *B41J 2/44* | (2006.01) |
| *H10N 30/50* | (2023.01) |
| *H10N 30/057* | (2023.01) |
| *H10N 30/857* | (2023.01) |

(52) U.S. Cl.
CPC .............. *H10N 30/098* (2023.02); *B05D 1/00* (2013.01); *B41J 2/442* (2013.01); *H10N 30/057* (2023.02); *H10N 30/50* (2023.02); *H10N 30/857* (2023.02)

(58) Field of Classification Search
CPC .............................. B05D 1/00; B05D 2518/10
See application file for complete search history.

(56) References Cited

U.S. PATENT DOCUMENTS

| | | |
|---|---|---|
| 6,172,150 B1 | 1/2001 | Kollmann et al. |
| 2011/0151614 A1 | 6/2011 | Lochtman et al. |
| 2011/0298878 A1 | 12/2011 | Jäger et al. |
| 2013/0104309 A1 | 5/2013 | Wukusick et al. |
| 2015/0315347 A1 | 11/2015 | Koellnberger et al. |
| 2016/0057835 A1 | 2/2016 | Wang et al. |
| 2016/0156066 A1 | 6/2016 | Gleason et al. |
| 2016/0204338 A1 | 7/2016 | Schmeer et al. |

(Continued)

FOREIGN PATENT DOCUMENTS

| | | |
|---|---|---|
| DE | 19644112 A1 | 5/1997 |
| DE | 102014003357 A1 | 9/2015 |

(Continued)

*Primary Examiner* — Hai Y Zhang
(74) *Attorney, Agent, or Firm* — BROOKS KUSHMAN P.C.

(57) ABSTRACT

At least one silicone layer is applied to a substrate by a method employing laser transfer printing. The method is suitable for producing sensors, actuators and other EAP layer systems. The silicone layer in these systems may serve as an electrically conducting electrode layer or as a dielectric layer. The method may be configured to be continuous and may be combined with various other coating technologies.

26 Claims, 6 Drawing Sheets

(56) References Cited

U.S. PATENT DOCUMENTS

| | | |
|---|---|---|
| 2017/0008210 A1 | 1/2017 | Koellnberger et al. |
| 2018/0036953 A1 | 2/2018 | Gottschalk-Gaudig |
| 2018/0066115 A1 | 3/2018 | Achenbach et al. |
| 2018/0281294 A1 | 10/2018 | Gottschalk-Gaudig et al. |
| 2020/0056047 A1 | 2/2020 | Koellnberger et al. |

FOREIGN PATENT DOCUMENTS

| | | | | |
|---|---|---|---|---|
| DE | 102014005851 A1 | 10/2015 | | |
| EP | 0787766 B2 | 3/2004 | | |
| JP | 11199691 A | 7/1999 | | |
| JP | 11288087 A | 10/1999 | | |
| JP | 2000143797 A | 5/2000 | | |
| JP | 2012107127 A | 6/2012 | | |
| WO | 09153192 A2 | 12/2009 | | |
| WO | 10069900 A1 | 6/2010 | | |
| WO | 14074554 A2 | 5/2014 | | |
| WO | 14090506 A1 | 6/2014 | | |
| WO | 14187976 A1 | 11/2014 | | |
| WO | 15113911 A1 | 8/2015 | | |
| WO | 15181810 A1 | 12/2015 | | |
| WO | WO-2015181810 A1 * | 12/2015 | ............ | B23K 26/34 |
| WO | 17020971 A1 | 2/2017 | | |
| WO | 17081028 A1 | 5/2017 | | |
| WO | 18036640 A1 | 3/2018 | | |
| WO | 18177523 A1 | 10/2018 | | |
| WO | 18183057 A1 | 10/2018 | | |

* cited by examiner

METHOD FOR APPLYING AT LEAST ONE SILICONE LAYER BY LASER TRANSFER PRINTING

CROSS REFERENCE TO RELATED APPLICATIONS

This application is the U.S. National Phase of PCT Appln. No. PCT/EP2019/052019 filed Jan. 28, 2019, the disclosure of which is incorporated in its entirety by reference herein.

BACKGROUND OF THE INVENTION

1. Field of the Invention

The invention relates to a method for applying at least one silicone layer by laser transfer printing, this method being suitable for producing sensors, actuators and other EAP layer systems.

The silicone layer in these systems may serve as an electrically conducting electrode layer or as a dielectric layer. The method may be configured to be continuous and may be combined with various other coating technologies.

2. Description of the Related Art

A variety of methods for producing silicone layers and/or silicone-based layer systems are known in the prior art.

DE 19644112 A1 describes a continuous method for producing silicone rubber casting films. In this method a two-component silicone composition is cast on a circulating belt in appropriate thickness and width. Introduction of heat from heating systems produces thermally activated vulcanization on the circulating belt. When the film has cured it is removed from the circulating belt, further heat-treated, and lastly rolled up.

WO 2014/090506 A1 describes a method for continuous production of thin silicone films of uniform film thickness, and also describes the silicone films produced by this method and their use. In this case a silicone compound is extruded through a slot die on a carrier belt and cured. When the film has cured it can be removed from the carrier belt or wound up with the carrier belt.

WO 2015/113911 A1 describes a method for producing multilayer composites having at least two thin silicone layers of uniform layer thickness.

US 2016/0057835 A1 describes the production of electroactive layer systems and components. Described in connection therewith are methods and steps for generating sheetlike electrodes (conductive layers) on non-conductive layers. Additionally, the use with electrochemical fillers or layers is mentioned.

US 2016/156066 A1 describes a method for modifying thin polymer layers by vapour deposition (i-CVD) with different dopants. Here, in a vacuum operation, a polymer is deposited evenly and very thinly, with variable dopants, on any desired surfaces or geometries.

WO 2014/187976 A1 describes a method for producing an elastomer-based film stack actuator by a continuous laminating process (dry deposition in a roll-to-roll process). The laminate is generated by prior detachment of the elastomer film from a carrier and lamination film, the deposition thereof on a further elastomer film printed with electrode material, and multiple repetition of these steps.

DE 10 2014 005 851 A1 describes an apparatus and a continuous stacking method for generating elastomer stack actuators. The method is confined to the precise lamination of the already coated electrode-elastomer film composite which is supplied. Using a circulating carrier belt or continuous feed, multiple repetition of the laminating procedure results in the construction of a multilayer structure. Laminar accuracy is accomplished by an adjusting unit and by optical and electrical sensor technology. The electrodes are contacted after each laminating step by the making of through-holes, which are filled in with contacting material.

WO 2014/074554 A2 describes a method for producing a multilayer, stacked, electroactive transducer in a circular operation. Two independent rolls supply the ultrathin films of electroactive polymer, detached beforehand from a carrier belt, to a continuous laminating step. The overall operation also includes printing stations for electrodes, and application of adhesive before the respective laminating step.

DE 10 2014 003 357 A1 describes a method for producing a surface-modified silicone layer. In this method, electrically conductive particles (carbon black, CNTs, silver nanoparticles) are applied to a non-crosslinked silicone layer, followed by curing in the composite system. The methodology for applying the particles pertains to a mechanical application comprising partial penetration into the silicone surface.

The known methods for applying silicone layers, especially those suitable for producing electrode layers and/or dielectric layers in actuators, sensors and other electroactive polymer layer systems, are limited in their variability, accuracy of application, throughput, and also in the later robustness and component effectiveness that are achieved.

One of the methods known in the prior art for the application of layers is that referred to as laser transfer printing. The use of this method, though, has so far been confined to low-viscosity liquid inks and dispersions, and also metals.

WO 2009/153192 A2 describes, for example, a method for producing conductive layers on semiconductor structures, wherein a metal powder dispersion is applied to a carrier and is detached by a laser beam from the carrier onto a target.

WO 2010/069900 A1 describes, for example, the laser transfer printing of ink.

WO 2015/181810 A1 describes a laser transfer method for printing metallic structures. A film of metal on a transparent carrier is heated locally and positioned in the form of drops.

SUMMARY OF THE INVENTION

It was an object of the present invention, therefore, to develop a flexible method which allows the effective application of silicone layers, the method being intended to enable the production of silicone layers or silicone layer systems as dielectrics and electrode layers for sensors, actuators or other elements based on electroactive polymers (EAPs).

This object is, surprisingly, achieved by the present invention. The application of silicone layers by laser transfer printing allows the effective production of an EAP layer or of an EAP layer system in a facility, and also the printing of electronic elements such as conductor tracks, heating systems, and resistors. The printed systems display better quality as a result of fewer operating steps and/or of optimized operating steps. The method makes possible, for example, the continuous production of silicone elastomer electronics, and also optimum electrodes with respect to charging surfaces and flexibility.

DETAILED DESCRIPTION OF THE PREFERRED EMBODIMENTS

Figure 1:
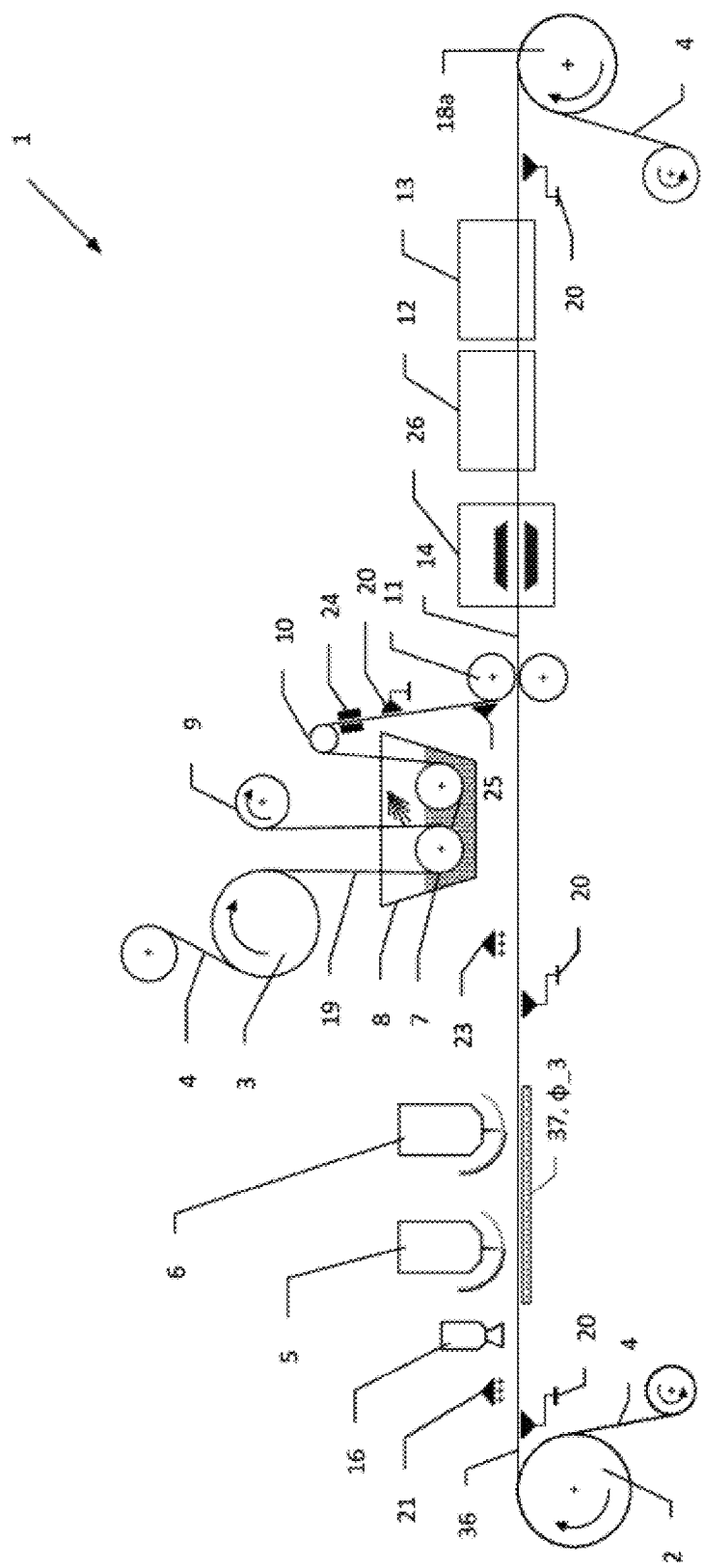
FIG. 1 shows a roll-to-roll process diagram for the production of multilayer silicone elastomer systems.

The invention relates to a method for applying at least one silicone layer by laser transfer printing, the method comprising the following steps:

(i) providing a laser source;

(ii) providing a printing-composition carrier beneath the laser source, the printing-composition carrier being transparent to laser radiation and being coated on the lower side with a crosslinkable silicone composition, and at least the surface of the crosslinkable silicone composition being charged to a potential phi_1;

(iii) providing a deposition carrier beneath the printing-compound carrier;

(iv) providing an electrode beneath the deposition carrier, the electrode being charged to a potential phi_3, where phi_1 and phi_3 have opposite polarities;

(v) irradiating the printing-compound carrier with laser beams, so that at least a part of the crosslinkable silicone composition is detached and is transferred to the deposition carrier; and (vi) forming a silicone layer by completely or partly crosslinking the silicone composition transferred to the deposition carrier.

In the context of the present invention, phi means ϕ.

Base materials which can be used for the silicone layer include in principle all silicone compositions known in the prior art. The silicone composition is preferably chosen such that its crosslinking is not already triggered by irradiation with the laser used for laser transfer printing. The compositions are preferably silicone elastomer compositions.

Silicone elastomer compositions may, for example, be addition-crosslinking, peroxidically crosslinking, condensation-crosslinking or radiation-crosslinking compositions. Peroxidically crosslinking or addition-crosslinking compositions are preferred. Particularly preferred are addition-crosslinking compositions.

The silicone elastomer compositions may have one- or two-component formulations. The silicone elastomer compositions are crosslinked by supply of heat, by UV light and/or by moisture. Suitable examples are the following silicone elastomer compositions: HTV (addition-crosslinking), HTV (radiation-crosslinking), LSR, RTV 2 (addition-crosslinking), RTV 2 (condensation-crosslinking), RTV 1, TPSE (thermoplastic silicone elastomer), thiol-ene and cyanoacetamide crosslinking systems.

The addition-crosslinking silicone compositions comprise at their most basic level:

(A) at least one linear compound which contains radicals having aliphatic carbon-carbon multiple bonds, (B) at least one linear organopolysiloxane compound having Si-bonded hydrogen atoms, or instead of (A) and (B) or in addition to (A) and (B)

(C) at least one linear organopolysiloxane compound which contains SiC-bonded radicals having aliphatic carbon-carbon multiple bonds, and Si-bonded hydrogen atoms, and (D) at least one hydrosilylation catalyst.

In one particular embodiment the silicone compositions are silicone elastomer compositions have fluorinated side groups, as described in WO 2018/177523 A1, for example. In this embodiment, component (A), (B) and/or (C) preferably comprise preferably at least 2.5 mol %, more preferably at least 5 mol %, of fluorinated side groups, such as 3,3,3-trifluoropropylmethylsiloxy and/or bis(3,3,3-trifluoropropyl)siloxy groups.

The silicone compositions may be one-component silicone compositions and two-component silicone compositions. In the latter case the two components of the compositions of the invention may comprise all constituents in any desired combination, generally with the proviso that one component does not simultaneously contain siloxanes with aliphatic multiple bonds, siloxanes with Si-bonded hydrogens and catalyst—in other words, essentially, does not simultaneously contain constituents (A), (B) and (D), or (C) and (D).

The compounds (A) and (B) and/or (C) that are used in the compositions of the invention are conventionally selected such that crosslinking is possible. For example, compound (A) contains at least two aliphatically unsaturated radicals, and (B) at least three Si-bonded hydrogen atoms, or compound (A) contains at least three aliphatically unsaturated radicals, and siloxane (B) at least two Si-bonded hydrogen atoms, or else, instead of compounds (A) and (B), siloxane (C) is used, which contains aliphatically unsaturated radicals and Si-bonded hydrogen atoms in the proportions stated above. Also suitable are mixtures of (A) and (B) and (C) having the above-stated proportions of aliphatically unsaturated radicals and Si-bonded hydrogen atoms.

The compound (A) used in accordance with the invention may comprise silicon-free organic compounds having preferably at least two aliphatically unsaturated groups, and also organosilicon compounds having preferably at least two aliphatically unsaturated groups, or else mixtures thereof.

Examples of silicon-free organic compounds (A) are 1,3,5-trivinylcyclohexane, 2,3-dimethyl-1,3-butadiene, 7-methyl-3-methylene-1,6-octadiene, 2-methyl-1,3-butadiene, 1,5-hexadiene, 1,7-octadiene, 4,7-methylene-4,7,8,9-tetrahydroindene, methylcyclopentadiene, 5-vinyl-2-norbornene, bicyclo[2.2.1]hepta-2,5-diene, 1,3-diisopropenylbenzene, polybutadiene containing vinyl groups, 1,4-divinylcyclohexane, 1,3,5-triallylbenzene, 1,3,5-trivinylbenzene, 1,2,4-trivinylcyclohexane, 1,3,5-triisopropenylbenzene, 1,4-divinylbenzene, 3-methylhepta-1,5-diene, 3-phenylhexa-1,5-diene, 3-vinylhexa-1,5-diene, and 4,5-dimethyl-4,5-diethylocta-1,7-diene, N, N'-methylenebisacrylamide, 1,1,1-tris-(hydroxymethyl)propane triacrylate, 1,1,1-tris(hydroxymethyl)propane trimethacrylate, tripropylene glycol diacrylate, diallyl ether, diallylamine, diallyl carbonate, N,N'-diallylurea, triallylamine, tris(2-methylallyl)amine, 2,4,6-triallyloxy-1,3,5-triazine, triallyl-s-triazine-2,4,6(1H,3H,5H)-trione, diallyl malonate, polyethylene glycol diacrylate, polyethylene glycol dimethacrylate, and poly (propylene glycol) methacrylate.

As constituent (A), the silicone compositions of the invention preferably comprise at least one aliphatically unsaturated organosilicon compound, in which case all aliphatically unsaturated organosilicon compounds used to date in addition-crosslinking compositions may be employed, such as, for example, silicone block copolymers having urea segments, silicone block copolymers having amide segments and/or imide segments and/or ester-amide segments and/or polystyrene segments and/or silarylene segments and/or carborane segments, and silicone graft copolymers having ether groups.

Organosilicon compounds (A) used that have SiC-bonded radicals with aliphatic carbon-carbon multiple bonds are preferably linear or branched organopolysiloxanes comprising units of the general formula (I)

$$R^4{}_a R^5{}_b SiO_{(4-a-b)/2} \quad (I)$$

where $R^4$ independently at each occurrence, identically or differently, is an organic or inorganic radical free from aliphatic carbon-carbon multiple bonds, $R^5$ independently at each occurrence, identically or differently, is a monovalent, substituted or unsubstituted, SiC-bonded hydrocarbon radical having at least one aliphatic carbon-carbon multiple bond, a is 0, 1, 2, or 3, and b is 0, 1, or 2, with the proviso that the sum a+b is less than or equal to 3 and there are at least 2 radicals $R^5$ per molecule.

Radical $R^4$ may comprise monovalent or polyvalent radicals, in which case the polyvalent radicals, such as divalent, trivalent and tetravalent radicals, for example, join two or more, such as two, three, or four, for instance, siloxy units of the formula (I) to one another.

Further examples of $R^4$ are the monovalent radicals —F, —Cl, —Br, —$OR^6$, —CN, —SCN, —NCO, and SiC-bonded, substituted or unsubstituted hydrocarbon radicals which may be interrupted by oxygen atoms or by the group —C(O)—, and also divalent radicals Si-bonded on both sides in accordance with formula (I). If radical $R^4$ comprises SiC-bonded, substituted hydrocarbon radicals, preferred substituents are halogen atoms, phosphorus-containing radicals, cyano radicals, —$OR^6$, —$NR^6$—, —$NR^6{}_2$, —$NR^6$—C(O)—$NR^6{}_2$, —C(O)—$NR^6{}_2$, —C(O)$R^6$, —C(O)$OR^6$, —$SO_2$—Ph and —$C_6F_5$. In that case $R^6$, independently at each occurrence, identically or differently, denotes a hydrogen atom or a monovalent hydrocarbon radical having 1 to 20 carbon atoms, and Ph is the phenyl radical.

Examples of radicals $R^4$ are alkyl radicals such as the methyl, ethyl, n-propyl, isopropyl, n-butyl, isobutyl, tert-butyl, n-pentyl, isopentyl, neopentyl, and tert-pentyl radicals, hexyl radicals such as the n-hexyl radical, heptyl radicals such as the n-heptyl radical, octyl radicals such as the n-octyl radical and isooctyl radicals such as the 2,2,4-trimethylpentyl radical, nonyl radicals such as the n-nonyl radical, decyl radicals such as the n-decyl radical, dodecyl radicals such as the n-dodecyl radical, and octadecyl radicals such as the n-octadecyl radical, cycloalkyl radicals such as cyclopentyl, cyclohexyl, cycloheptyl, and methylcyclohexyl radicals, aryl radicals such as the phenyl, naphthyl, anthryl, and phenanthryl radicals, alkaryl radicals such as o-, m-, p-tolyl radicals, xylyl radicals, and ethylphenyl radicals, and aralkyl radicals such as the benzyl radical, and the α- and the β-phenylethyl radicals.

Examples of substituted radicals $R^4$ are haloalkyl radicals such as the 3,3,3-trifluoro-n-propyl radical, the 2,2,2,2',2',2'-hexafluoroisopropyl radical, the heptafluoroisopropyl radical, haloaryl radicals, such as the o-, m- and p-chlorophenyl radical, —$(CH_2)$—$N(R^6)C(O)NR^6{}_2$, —$(CH_2)_n$—C(O)$NR^6{}_2$, —$(CH_2)_o$—C(O)$R^6$, —$(CH_2)_o$—C(O)$OR^6$, —$(CH_2)_o$—C(O)$NR^6{}_2$, —$(CH_2)$—C(O)—$(CH_2)_p$C(O)$CH_3$, —$(CH_2)$—O—CO—$R^6$, —$(CH_2)$—$NR^6$—$(CH_2)_p$—$NR^6{}_2$, —$(CH_2)_o$—O—$(CH_2)_p$CH(OH)$CH_2$OH, —$(CH_2)_o$(OCH$_2$CH$_2$)$_p OR^6$, —$(CH_2)_o$—$SO_2$—Ph and —$(CH_2)_o$—O—$C_6F_5$, where $R^6$ and Ph correspond to the definition indicated therefor above, and o and p are identical or different integers between 0 and 10.

Examples of $R^4$ as divalent radicals Si-bonded on both sides in accordance with formula (I) are radicals which derive from the monovalent examples stated above for radical $R^4$ by virtue of an additional bond taking place through substitution of a hydrogen atom; examples of such radicals are —$(CH_2)$—, —CH($CH_3$)—, —C($CH_3$)$_2$—, —CH($CH_3$)—$CH_2$—, —$C_6H_4$—, —CH(Ph)—$CH_2$—, —C($CF_3$)$_2$—, —$(CH_2)_o$—$C_6H_4$—$(CH_2)_o$—, —$(CH_2)_o$—$C_6H_4$—$C_6H_4$—$(CH_2)_o$—, —$(CH_2O)_p$, $(CH_2CH_2O)_o$, —$(CH_2)_o$—$O_x$—$C_6H_4$—$SO_2$—$C_6H_4$—$O_x$—$(CH_2)_o$—, where x is 0 or 1, and Ph, o and p have the definition stated above.

Preferably radical $R^4$ comprises a monovalent, SiC-bonded, optionally substituted hydrocarbon radical which has 1 to 18 carbon atoms and is free from aliphatic carbon-carbon multiple bonds, more preferably a monovalent, SiC-bonded hydrocarbon radical which has 1 to 6 carbon atoms and is free from aliphatic carbon-carbon multiple bonds, and more particularly the methyl or phenyl radical.

Radical $R^5$ from formula (I) may comprise any desired groups amenable to an addition reaction (hydrosilylation) with an SiH-functional compound. If radical $R^5$ comprises SiC-bonded, substituted hydrocarbon radicals, preferred substituents are halogen atoms, cyano radicals and —$OR^6$, where $R^6$ has the above-stated definition.

Preferably radical $R^5$ comprises alkenyl and alkynyl groups having 2 to 16 carbon atoms, such as vinyl, allyl, methallyl, 1-propenyl, 5-hexenyl, ethynyl, butadienyl, hexadienyl, cyclopentenyl, cyclopentadienyl, cyclohexenyl, vinylcyclohexylethyl, divinylcyclohexylethyl, norbornenyl, vinylphenyl and styryl radicals, with vinyl, allyl, and hexenyl radicals being particularly preferred for use.

The molecular weight of the constituent (A) may vary within wide limits, as for instance between $10^2$ and $10^6$ g/mol. Hence, for example, constituent (A) may comprise a relatively low molecular mass, alkenyl-functional oligosiloxane, such as 1,2-divinyltetramethyldisiloxane, but may also be a high-polymeric polydimethylsiloxane, for example with a molecular weight of $10^5$ g/mol (number average determined by means of NMR), that possesses in-chain or terminal Si-bonded vinyl groups. The structure of the molecules forming the constituent (A) is also not fixed; in particular, the structure of a siloxane of relatively high molecular mass, in other words an oligomeric or polymeric siloxane, may be linear, cyclic, branched, or else resinous, network-like. Linear and cyclic polysiloxanes are preferably composed of units of the formula $R^4{}_3SiO_{1/2}$, $R^5R^4{}_2SiO_{1/2}$, $R^5R^4SiO_{1/2}$, and $R^4{}_2SiO_{2/2}$, where $R^4$ and $R^5$ have the definition indicated above. Branched and network-like polysiloxanes additionally include trifunctional and/or tetrafunctional units, with preference being given to those of the formulae $R^4SiO_{3/2}$, $R^5SiO_{3/2}$ and $SiO_{4/2}$. It will be appreciated that mixtures of different siloxanes satisfying the criteria of constituent (A) may also be used.

Particularly preferred as component (A) is the use of vinyl-functional, substantially linear polydiorganosiloxanes having a viscosity of 0.01 to 500,000 Pa·s, more preferably 0.1 to 100,000 Pa·s, in each case at 25° C., measured according to DIN EN ISO 3219: 1994 and DIN 53019, using a calibrated rheometer with a cone/plate system, cone CP50-2 with an opening angle of 2°, and a shear rate of 1 s$^{-1}$.

As organosilicon compounds (B) it is possible to use all hydrogen-functional organosilicon compounds which have also been employed to date in addition-crosslinkable compositions.

Organopolysiloxanes (B) used which have Si-bonded hydrogen atoms are preferably linear, cyclic or branched organopolysiloxanes composed of units of the general formula (III)

$$R^4_c H_d SiO_{(4-c-d)/2} \quad \text{(III)}$$

where
$R^4$ has the definition stated above,
c is 0, 1, 2 or 3, and
d is 0, 1 or 2,
with the proviso that the sum of c+d is less than or equal to 3 and there are at least two Si-bonded hydrogen atoms per molecule.

The organopolysiloxane (B) used in accordance with the invention preferably contains Si-bonded hydrogen in the range from 0.04 to 1.7 percent by weight, based on the total weight of the organopolysiloxane (B).

The molecular weight of the constituent (B) may likewise vary within wide limits, as for instance between $10^2$ and $10^6$ g/mol. Thus constituent (B) may comprise, for example, an SiH-functional oligosiloxane of relatively low molecular mass, such as tetramethyldisiloxane, or alternatively may comprise a silicone resin having SiH groups or a high-polymeric polydimethylsiloxane that possesses SiH groups within the chain or terminally.

The structure of the molecules that form the constituent (B) is also not fixed; in particular, the structure of an SiH-containing siloxane of relatively high molecular mass, in other words oligomeric or polymeric, may be linear, cyclic, branched, or else resinous, network-like. Linear and cyclic polysiloxanes (B) are composed preferably of units of the formula $R^4_3SiO_{1/2}$, $HR^4_2SiO_{1/2}$, $HR^4SiO_{2/2}$, and $R^4_2SiO_{2/2}$, with $R^4$ having the definition indicated above. Branched and network-like polysiloxanes additionally include trifunctional and/or tetrafunctional units, with preference being given to those of the formulae $R^4SiO_{3/2}$, $HSiO_{3/2}$, and $SiO_{4/2}$, where $R^4$ has the definition indicated above.

It will be appreciated that mixtures of different siloxanes satisfying the criteria of constituent (B) may also be used. In particular, the molecules forming constituent (B) may optionally at the same time also contain aliphatically unsaturated groups in addition to the obligatory SiH groups. Particularly preferred is the use of low molecular mass, SiH-functional compounds such as tetrakis(dimethylsiloxy) silane and tetramethylcyclotetrasiloxane, and also of SiH-containing siloxanes of higher molecular mass, such as poly(hydrogenmethyl)siloxane and poly(dimethylhydrogenmethyl)siloxane with a viscosity at 25° C. of 10 to 20,000 mPa·s, measured according to DIN EN ISO 3219: 1994 and DIN 53019, using a calibrated rheometer with a cone/plate system, cone CP50-2 with an opening angle of 2°, and a shear rate of 1 s$^{-1}$, or similar SiH-containing compounds in which some of the methyl groups have been replaced by 3,3,3-trifluoropropyl or phenyl groups.

The amount of constituent (B) in the crosslinkable silicone compositions of the invention is preferably such that the molar ratio of SiH groups to aliphatically unsaturated groups from (A) is 0.1 to 20, more preferably between 0.3 and 2.0.

The components (A) and (B) used in accordance with the invention are commercial products and/or may be prepared by methods that are commonplace.

Instead of component (A) and (B), the silicone compositions of the invention may comprise organopolysiloxanes (C), simultaneously having aliphatic carbon-carbon multiple bonds and Si-bonded hydrogen atoms. The silicone compositions of the invention may also comprise all three components (A), (B) and (C).

If siloxanes (C) are used, those concerned are preferably composed of units of the general formulae (IV), (V) and (VI)

$$R^4_f SiO_{4/2} \quad \text{(IV)}$$

$$R^4_g R^5 SiO_{3-g/2} \quad \text{(V)}$$

$$R^4_h HSiO_{3-h/2} \quad \text{(VI)}$$

where
$R^4$ and $R^5$ have the definition indicated for them above,
f is 0, 1, 2 or 3,
g is 0, 1 or 2, and
h is 0, 1 or 2,
with the proviso that per molecule there are at least two radicals $R^5$ and at least two Si-bonded hydrogen atoms.

Examples of organopolysiloxanes (C) are those comprising $SiO_{4/2}$, $R^4_3SiO_{1/2}$, $R^4_2R^5SiO_{1/2}$ and $R^4_2HSiO_{1/2}$ units, known as MP resins, and these resins may additionally contain $R^4SiO_{3/2}$ and $R^4_2SiO$ units, and also linear organopolysiloxanes substantially consisting of $R^4_2R^5SiO_{1/2}$, $R^4_2SiO$ and $R^4HSiO$ units, with $R^4$ and $R^5$ meeting the aforementioned definition.

The organopolysiloxanes (C) preferably possess an average viscosity of 0.01 to 500,000 Pa·s, more preferably 0.1 to 100,000 Pa·s, in each case at 25° C., measured according to DIN EN ISO 3219: 1994 and DIN 53019, using a calibrated rheometer with a cone/plate system, cone CP50-2 with an opening angle of 2°, and a shear rate of 1 s$^{-1}$.

Organopolysiloxanes (C) are available commercially or preparable by methods that are commonplace.

Addition-crosslinking silicone compositions of the invention may be selected from the group containing:
at least one each of compounds (A), (B) and (D),
at least one each of compounds (C) and (D), and
at least one each of compounds (A), (B), (C) and (D),
where the definitions are as follows:
(A) an organic compound or an organosilicon compound, containing at least two radicals having aliphatic carbon-carbon multiple bonds,
(B) an organosilicon compound containing at least two Si-bonded hydrogen atoms,
(C) an organosilicon compound containing SiC-bonded radicals having aliphatic carbon-carbon multiple bonds, and Si-bonded hydrogen atoms, and
(D) a hydrosilylation catalyst.

The silicone composition contains typically 30-95 wt %, preferably 30-80 wt % and more preferably 40-70 wt % of (A), based on the total mass of the silicone composition.

The silicone composition contains typically 0.1-60 wt %, preferably 0.5-50 wt % and more preferably 1-30 wt % of (B), based on the total mass of the silicone composition.

If the silicone composition does contain component (C), there is typically 30-95 wt %, preferably 30-80 wt %, more preferably 40-70 wt % of (C) in the formulation, based on the total mass of the silicone composition.

The amount of component (D) may be between 0.1 and 1000 parts per million (ppm), 0.5 and 100 ppm or 1 and 25 ppm of the platinum group metal, depending on total weight of the components.

The amounts of all the components present in the silicone composition are chosen such that in total they do not exceed 100 wt %, based on the total mass of the silicone composition.

As hydrosilylation catalyst (D) it is possible to use all of the catalysts known to the state of the art. Component (D) may be a platinum group metal, as for example platinum, rhodium, ruthenium, palladium, osmium or iridium, or an organometallic compound, or a combination thereof. Examples of component (D) are compounds such as hexachloroplatinic(IV) acid, platinum dichloride, platinum acetylacetonate, and complexes of said compounds encapsulated in a matrix or in a core/shell-like structure. The platinum complexes with low molecular weight of the organopolysiloxanes include 1,3-diethenyl-1,1,3,3-tetramethyldisiloxane complexes with platinum. Other examples are platinum-phosphite complexes, platinum-phosphine complexes or alkyl platinum complexes. These compounds may be encapsulated within a resin matrix.

The concentration of component (D) for catalysing the hydrosilylation reaction of components (A) and (B) on exposure is sufficient in order to generate the heat required here in the method described. The amount of component (D) may be between 0.1 and 1000 parts per million (ppm), 0.5 and 100 ppm, or 1 and 25 ppm of the platinum group metal, depending on the total weight of the components. The curing rate may be low if the constituent of the platinum group metal is below 1 ppm. The use of more than 100 ppm of the platinum group metal is uneconomic or may lower the stability of the adhesive formulation.

The silicone composition preferably comprises platinum complexes of the general formula (VII)

(VII), where in formula (VII)
Cp denotes cyclopentadienyl radical,
n is an integer from 1 to 8,
o is 0, 1, 2 or 3,
p is 0, 1, 2 or 3, with the proviso that o+p=3,
r is 1, 2, 3, 4 or 5, preferably 1, 2 or 3, more preferably 1 or 2, more particularly 1,
t is 0, 1, 2, 3 or 4, preferably 0 or 1, more preferably 1, with the proviso that r+t≤5, preferably 3,
s is 0, 1 or 2, preferably 2,
R may be the same or different and denotes a hydrogen atom or a monovalent, unsubstituted or substituted, hydrocarbon radical,
$R^1$ may be the same or different and denotes a monovalent, unsubstituted or substituted hydrocarbon radical which may be interrupted by heteroatoms,
$R^2$ may be the same or different and denotes a hydrolysable group or a siloxy radical attached via oxygen,
$R^7$ may be the same or different and denotes a monovalent, unsubstituted or substituted, aliphatically saturated hydrocarbon radical which may be interrupted by heteroatoms, or denotes a siloxy radical attached via oxygen,
$R^8$ may be the same or different and is an aliphatically unsaturated, optionally substituted radical,
$R^3$ may be the same or different and denotes a monovalent, unsubstituted or substituted, aliphatically saturated hydrocarbon radical,
$R^4$ may be the same or different and denotes a hydrogen atom, SiC-bonded silyl radical or an unsubstituted or substituted hydrocarbon radical which may be interrupted by heteroatoms.

Examples of such platinum complexes of the formula (VII) are
trimethyl[(allyldimethylsilyl)cyclopentadienyl]platinum (IV),
trimethyl[((2-methylallyl)dimethylsilyl)cyclopentadienyl]platinum(IV),
trimethyl[(trimethoxysilyl)methyl(allyldimethylsilyl)cyclopentadienyl]platinum(IV),
trimethyl[(2-trimethoxysilyl)ethyl(allyldimethylsilyl)cyclopentadienyl]platinum(IV),
trimethyl[(3-trimethoxysilyl)propyl(allyldimethylsilyl)cyclopentadienyl]platinum(IV),
trimethyl[(3-dimethoxymethylsilyl)propyl(allyldimethylsilyl)cyclopentadienyl]platinum(IV),
trimethyl[(4-trimethoxysilyl)butyl(allyldimethylsilyl)cyclopentadienyl]platinum(IV),
trimethyl[(2-trimethoxysilyl)-1-methylethyl(allyldimethylsilyl)cyclopentadienyl]platinum(IV),
trimethyl[(3-trimethoxysilyl)-2-methyl-2-propyl(allyldimethylsilyl)cyclopentadienyl]platinum(IV),
trimethyl[bis(allyldimethylsilyl)cyclopentadienyl]platinum(IV),
trimethyl[bis(2-methylallyldimethylsilyl)cyclopentadienyl]platinum(IV),
trimethyl[(trimethoxysilyl)methylbis(allyldimethyl-silyl)cyclopentadienyl]platinum(IV),
trimethyl[(2-trimethoxysilyl)ethyl-bis(allyldimethylsilyl)cyclopentadienyl]platinum(IV),
trimethyl[(3-trimethoxysilyl)propyl-bis(allyldimethylsilyl)cyclopentadienyl]platinum(IV),
trimethyl[(4-trimethoxysilyl)butyl-bis(allyldimethylsilyl)cyclopentadienyl]platinum(IV),
trimethyl[(2-trimethoxysilyl)-1-methylethyl-bis(allyldimethylsilyl)cyclopentadienyl]platinum(IV),
trimethyl[(3-trimethoxysilyl)-2-methyl-2-propyl-bis(allyldimethylsilyl)cyclopentadienyl]platinum(IV),
trimethyl[tris(allyldimethylsilyl)cyclopentadienyl]platinum(IV),
trimethyl[(triethoxysilyl)methyl(allyldimethylsilyl)cyclopentadienyl]platinum(IV),
trimethyl[(triacetoxysilyl)methyl-(allyldimethylsilyl)cyclopentadienyl]platinum(IV),
trimethyl[(3-bis-trimethylsiloxy)methylsilylpropyl](allyldimethylsilyl)cyclopentadienylplatinum(IV),
trimethyl[(3-triethoxysilyl)propyl-(allyldimethylsilyl)cyclopentadienyl]platinum(IV),
trimethyl[(triethoxysilyl)methyl-bis(allyldimethylsilyl)cyclopentadienyl]platinum(IV),
trimethyl[(3-triethoxysilyl)propyl-bis(allyldimethylsilyl)cyclopentadienyl]platinum(IV),
trimethyl[(triethoxysilyl)methyl-tris(allyldimethylsilyl)cyclopentadienyl]platinum(IV),
triethyl[(allyldimethylsilyl)cyclopentadienyl]platinum (IV),
tris(trimethylsilylmethyl)[(allyldimethylsilyl)cyclopentadienyl]platinum(IV),
triethyl[(trimethoxysilyl)methyl(allyldimethylsilyl)cyclopentadienyl]platinum(IV),
triethyl[(trimethoxysilyl)methyl-bis(allyldimethylsilyl)cyclopentadienyl]platinum(IV),
triethyl[tris(allyldimethylsilyl)cyclopentadienyl]platinum (IV) and
triethyl[(trimethoxysilyl)methyltris(allyldimethylsilyl)cyclopentadienyl]platinum(IV).

These platinum complexes are for example described in WO 2016/030325 A1.

In another embodiment the silicone compositions are peroxidically crosslinkable silicone materials. These silicone materials may be crosslinked organically through the addition of organic peroxides (as component D). In this case the silicone composition consists at least of components (A) and (D). In that case there is preferably between 0.1 and 20 wt % of component (D) in the silicone rubber materials of the invention. Crosslinkers in the sense of component (D) that may be used include all typical peroxides conforming to the prior art. Examples of component (D) are dialkyl peroxides, such as 2,5-dimethyl-2,5-di(tert-butylperoxy) hexane, 1,1-di(tert-butylperoxy)cyclohexane, 1,1-di(tert-butylperoxy)-3,3,5-trimethylcyclohexane, α-hydroxyperoxy-α'-hydroxydicyclohexyl peroxide, 3,6-dicyclohexylidene-1,2,4,5-tetroxane, di-tert-butyl peroxide, tert-butyl tert-triptyl peroxide and tert-butyl triethyl-5-methyl peroxide, diaralkyl peroxides, such as dicumyl peroxide, alkyl aralkyl peroxides, such as tert-butyl cumyl peroxide and α,α'-di(tert-butylperoxy)-m/p-diisopropylbenzene, alkyl acyl peroxides, such as t-butyl perbenzoate, and diacyl peroxides, such as dibenzoyl peroxide, bis(2-methylbenzoyl peroxide), bis(4-methylbenzoyl peroxide) and bis (2,4-dichlorobenzoyl peroxide). Preference is given to using vinyl-specific peroxides, the prime representatives of these being the dialkyl and diaralkyl peroxides. Particularly preferred is the use of 2,5-dimethyl-2,5-di(tert-butylperoxy) hexane and dicumyl peroxide. Individual peroxides or mixtures of different peroxides can be used. The amount of constituent (D) in the peroxidically crosslinkable silicone rubber material is preferably between 0.1 and 5.0 wt %, more preferably between 0.5 and 1.5 wt %. Preference is therefore given to the crosslinkable silicone rubber materials of the invention, characterized in that the crosslinker (D) is present from 0.1 to 5.0 weight % and represents an organic peroxide or a mixture of organic peroxides, based in each case on the total mass of the silicone composition.

The materials described may optionally comprise all further adjuvants which have also been used hitherto for producing peroxide- and addition-crosslinkable compositions.

These adjuvants may also be added to all condensation-crosslinking silicone elastomer compositions known in the prior art. A more detailed description of the type of crosslinking is described for example in EP 0787766 A1.

The examples of optional components include, among others, (E) fillers.

Examples of reinforcing fillers, which may be used as a component in the silicone compositions of the invention, are fumed or precipitated silicas having BET surface areas of at least 50 m$^2$/g, and also carbon blacks and activated carbons such as furnace black and acetylene black, with preference being given to fumed and precipitated silicas having BET surface areas of at least 50 m$^2$/g. The stated silica fillers may have a hydrophilic character or may have been made hydrophobic by known methods. The amount of actively reinforcing filler in the crosslinkable composition is within the range from 0 to 70 wt %, preferably 0 to 50 wt %, based on the total mass of the silicone composition.

With particular preference the crosslinkable silicone rubber materials are characterized in that the filler (E) is surface-treated. The surface treatment is obtained by methods known in the prior art for hydrophobizing finely divided fillers. The hydrophobization may for example take place either before incorporation into the polyorganosiloxane or else in the presence of a polyorganosiloxane, by the in-situ method. Both methods may be carried out both as a batch operation and continuously. Hydrophobizing agents whose use is preferred are organosilicon compounds which are able to react with the filler surface to form covalent bonds or are permanently physisorbed on the filler surface. Examples of hydrophobizing agents are alkylchlorosilanes, such as methyltrichlorosilane, dimethyldichlorosilane, trimethylchlorosilane, octyltrichlorosilane, octadecyltrichlorosilane, octylmethyldichlorosilane, octadecylmethyldichlorosilane, octyldimethylchlorosilane, octadecyldimethylchlorosilane and tert-butyldimethylchlorosilane; alkylalkoxysilanes, such as dimethyldimethoxysilane, dimethyldiethoxysilane, trimethylmethoxysilane and trimethylethoxysilane; trimethylsilanol; cyclic diorgano(poly)siloxanes, such as octamethylcyclotetrasiloxane, decamethylcyclopentasiloxane; linear diorganopolysiloxanes, such as dimethylpolysiloxanes having trimethylsiloxy end groups and also dimethylpolysiloxanes having silanol or alkoxy end groups; disilazanes, such as hexaalkyldisilazanes, especially hexamethyldisilazane, divinyltetramethyldisilazane, bis(trifluoropropyl)tetramethyldisilazane; cyclic dimethylsilazanes, such as hexamethylcyclotrisilazane. Mixtures of the hydrophobizing agents stated earlier on above may also be used. To accelerate the hydrophobization, the addition of catalytically active additives also takes place optionally, such as amines, metal hydroxides and water, for example.

The hydrophobization may be accomplished, for example, in one step, using one or a mixture of two or more hydrophobizing agent(s), or else using one or more hydrophobizing agents in two or more steps.

As a result of a surface treatment, preferred fillers (E) have a carbon content of at least 0.01 up to a maximum of 20 wt %, more preferably between 0.1 and 10 wt %, most preferably between 0.5 to 5 wt %, based on the total mass of the silicone composition. Particular preference is given to those crosslinkable silicone rubber materials which are characterized in that the filler (E) is a surface-treated silica having 0.01 to 2 wt % of Si-bonded, aliphatically unsaturated groups based on the total mass of the filler. These groups are, for example, Si-bonded vinyl groups. In the silicone rubber material of the invention, the constituent (E) is used preferably as individual or likewise preferably as a mixture of two or more finely divided fillers.

The silicone composition of the invention may alternatively include as constituents further additives in a weight fraction of up to 70 wt %, preferably 0.0001 to 40 wt %, based on the total mass of the silicone composition. These additions may be, for example, inert fillers, resinous polyorganosiloxanes, different from the siloxanes (A), (B) and (C), reinforcing and nonreinforcing fillers, fungicides, fragrances, rheological additives, corrosion inhibitors, oxidation inhibitors, light stabilizers, flame retardants, and agents for influencing the electrical properties, dispersing assistants, solvents, adhesion promoters, pigments, dyes, plasticizers, organic polymers, heat stabilizers, etc. These include additions, such as finely ground quartz, diatomaceous earth, clays, chalk, lithopone, carbon blacks, graphite, graphene, metal oxides, metal carbonates, metal sulfates, metal salts of carboxylic acids, metal dusts, fibres, nano fibres such as glass fibres, polymeric fibres, polymeric powder, dyes, pigments, etc.

These fillers, moreover, may be heat-conducting or electrically conducting. Electrically conducting fillers may be used, for example, to produce electrically conducting silicone layers, which may in turn serve as an electrode layer in sensors, actuators or other EAP systems. Examples of heat-conducting fillers are aluminium nitride; aluminium oxide; barium titanate; beryllium oxide; boron nitride; diamond; graphite; magnesium oxide; particulate metals such as, for example, copper, gold, nickel, or silver; silicon carbide; tungsten carbide; zinc oxide, and/or a combination thereof. Heat-conducting fillers are known in the prior art and are available commercially. For example, CB-A20S and Al-43-Me are aluminium oxide fillers in different particle sizes, available commercially from Showa-Denko, and AA-04, AA-2 and AAI 8 are aluminium oxide fillers which are available commercially from Sumitomo Chemical Company. Silver fillers are available commercially from Metalor Technologies U.S.A. Corp. of Attleboro, Massachusetts, U.S.A. Boron nitride fillers are available commercially from Advanced Ceramics Corporation, Cleveland, Ohio, U.S.A.

The reinforcing fillers include silica and chopped fibres such as Kevlar® chopped fibres, for example. A combination may be used of fillers with different particle sizes and varying particle size distributions.

The silicone composition may further comprise one or more optional components. The examples of optional components include, among others, (F) one or more solvents, and (G) one or more inhibitors.

The silicone composition may additionally optionally comprise (F) one or more solvents. It should be ensured, however, that the solvent has no adverse effects on the system as a whole. Suitable solvents are known in the prior art and are available commercially. The solvent may be, for example, an organic solvent having 3 to 20 carbon atoms. The examples of solvents include aliphatic hydrocarbons such as nonane, decalin and dodecane, for example; aromatic hydrocarbons such as mesitylene, xylene and toluene, for example; esters such as ethyl acetate and butyrolactone, for example; ethers such as n-butyl ether and polyethylene glycol monomethyl ether, for example; ketones such as, for example, methyl isobutyl ketone and methyl pentyl ketone; silicone fluid such as, for example, linear, branched and cyclic polydimethylsiloxanes, and combinations of these solvents. The optimum concentration of a particular solvent in an adhesive formulation may be determined easily by means of routine experiments. Depending on the weight of the compound, the amount of the solvent, based on the total weight of the silicone composition, may be between 0 and 95% or between 1 and 95%.

Inhibitors (G) and stabilizers serve for the targeted setting of the working time, onset temperature and crosslinking rate of the silicone compositions of the invention. These inhibitors and stabilizers are very well known within the field of addition-crosslinking compositions. Examples of commonplace inhibitors are acetylenic alcohols, such as 1-ethynyl-1-cyclohexanol, 2-methyl-3-butyn-2-ol and 3,5-dimethyl-1-hexyn-3-ol, 3-methyl-1-dodecyn-3-ol, polymethylvinylcyclosiloxanes such as 1,3,5,7-tetravinyltetramethyltetracyclosiloxane, low molecular mass silicone oils with methylvinyl-SiO$_{1/2}$ groups and/or R$_2$vinylSiO$_{1/2}$ end groups, such as divinyltetramethyldisiloxane, divinyltetramethydisiloxane, tetravinyldimethyldisiloxane, trialkyl cyanurates, alkyl maleates, such as diallyl maleates, dimethyl maleate and diethyl maleate, alkyl fumarates, such as diallyl fumarate and diethyl fumarate, organic hydroperoxides such as cumene hydroperoxide, tert-butyl hydroperoxide and pinane hydroperoxide, organic peroxides, organic sulfoxides, organic amines, diamines and amides, phosphanes and phosphites, nitriles, triazoles, diaziridines, and oximes. The activity of these inhibitor additions (E) is dependent on their chemical structure, and so the concentration must be determined individually.

Inhibitors and inhibitor mixtures are added preferably in a quantitative fraction of 0.00001% to 5%, based on the total weight of the mixture, preferably 0.00005 to 2%, and more preferably 0.0001 to 1%.

After all of the components of the silicone composition have been mixed, the dynamic viscosity at a shear rate of 1 s$^{-1}$ is between 10 mPa·s and 1000 Pa·s, preferably between 100 mPa·s and 100 Pa·s and more preferably between 200 mPa·s and 50 Pa·s, measured according to DIN EN ISO 3219: 1994 and DIN 53019 using a calibrated rheometer with a cone/plate system, cone CP50-2 with an opening angle of 2°, at 25° C. and a shear rate of 1 s$^{-1}$.

A suitable instrument is, for example, the MCR302 rheometer instrument available from Anton Paar GmbH, Austria (105 µm dimension).

The crosslinkable silicone compositions of the invention have the advantage that they can be produced in a simple method using readily available starting materials and hence economically. The crosslinkable compositions of the invention have the further advantage that as a one-component formulation they exhibit high storage stability at 25° C. and ambient pressure and they crosslink rapidly only at elevated temperature. The silicone compositions of the invention have the advantage that in the case of two-component formulation, after the mixing of the two components, they give rise to a crosslinkable silicone material whose workability persists over a long period at 25° C. and ambient pressure, thus exhibiting an extremely long pot life, with rapid crosslinking only at elevated temperature.

Examples of silicone compositions which are available on the market are (depending on the viscosity of the materials, solvent may be added for better workability):

Materials from WACKER Chemie AG: ELASTOSIL® P series (7010, 7600, 7613, 7161-160, 7616-195, 7618, 7619, 7622, 7623, 7624, 7628, 7629, 7630, 7633, 7636, 7642-220, 7670, 671, 7676, 7682, 7683/15, 7683/25, 7683/47, 7683/50, 7683/55, 7684/60, 7685, 7686, 7687, 7688, 7700, 7710, 7720, 7731, 7742, 7770, 7707 US, 7915, etc.), ELASTOSIL® M series (4115, 4125, 4370, 4400, 4440, 4441, 4470, 4600, 4601, 4615, 4630, 4635, 4640, 4645, 4641, 4643, 4644, 4670, 4647, 4648, 4670), ELASTOSIL® RT series (601, 602, 604, 607, 615, 617, 619, 620, 622, 623, 624, 625, 626, 627, 628, 629, 630, 633, 646, 670, 672, 675, 678, 685, etc.), ELASTOSIL® SOLAR series (2000, 2200, 2202, 3210, etc.), ELASTOSIL® LR series (3003/03, 3003/05, 3003/10, 3003/20, 3070/20, 3844/20, 3846/20, 3856/20, 3003/30, 3004/30, 3005/30, 3040/30, 3044/30, 3065/30, 3070/30, 3071/30, 3072/30, 3843/30, 3844/30, 3846/30, 3856/30, 3003/40, 3003/50, 3003/60, 3003/70, 3003/80, 3003/85, 3004/40, 3004/50, 3004/60, 3004/70, 3005/40, 3005/50, 3005/60, 3040/40, 3040/50, 3040/60, 3043/40, 3043/50, 3043/60, 3043/70, 3015/70, 3023/60, 3092/65, 3094/60, 3065/50, 3066/40, 3066/60, 3066/80, 3070/40, 3070/50, 3070/60, 3071/40, 3071/50, 3071/60, 3072/40, 3074/60, 3076/70, 3170/40, 3841/50, 3842/40, 3842/50, 3842/60, 3842/70, 3162, etc.), ELASTOSIL® FLR series (3900/40, 3900/60, 3905/40, 3905/60, etc.), ELASTOSIL® R series, WACKER SILGEL® series (610, 611, 612, 613, 616, 619, etc.), SEMICOSIL® series, POWERSIL® series, LUMISIL® series, GENIOMER® series, SILPURAN® series, DEHESIVE® series.

Further to the above-stated crosslinkable silicone compositions it is additionally possible, for the application of additional layers, to use non-curing silicone compositions such as silicone oils, for example. In this context the following products of WACKER Chemie AG, Germany, can be used: WACKER® AK SILICONOEL series, POWER- SIL® FLUID TR series, SILFAR® series. It is possible generally to employ silicone-based PSAs (pressure-sensitive adhesives).

Also of advantage in various applications is the use of non-curing printing compounds as support material or release layer. These materials can be removed subsequently from or out of the printed body, without residue, by flushing and/or heating. A common printing compound here is polyethylene glycol (PEG). Suitable support materials are described for example in WO 2017/020971 A1 and WO 2018/036640 A1.

The silicone layers, silicone films, and the individual layers of silicone multilayer composites that are stated in the present disclosure preferably have a thickness of 0.1 to 400 µm, more preferably 1 to 200 µm, yet more preferably 1 to 150 µm, and especially 5 to 100 µm, and each have a thickness accuracy of ±5%, measured on an area of 200 $cm^2$; the preferred thickness accuracy is in each case ±3%.

The determination of the absolute layer thickness may be made by means of a SEM analysis (scanning electron microscope analysis) and is carried out with a cryosection. The surface quality and roughness are ascertained, for example, using a confocal microscope.

Preferably at least the surface of the deposition carrier (36) that faces the printing-compound carrier (33) or the silicone material (35) is charged to a potential phi_2, where phi_2 and phi_1 have opposite polarities and phi_2 and phi_1 are chosen such that at least part of the charge quantity of the silicone composition transferred onto the deposition carrier (36) in step (v) is neutralized on the surface of the deposition carrier (36).

Disposed between the printing-compound carrier and the silicone composition is preferably an opaque detachment layer which heats up on irradiation with laser beams. This opaque detachment layer may be permanently joined to the printing-compound carrier, or may be configured as a detaching or dissolving layer.

The focal point of the laser beams is preferably located above the printing-compound carrier.

Preferably the silicone composition has a dynamic viscosity of 10 mPa·s or more and 1000 Pa·s or less, more preferably 1 to 100 Pa·s, measured according to DIN EN ISO 3219: 1994 and DIN 53019 by a calibrated rheometer having a cone-plate system, cone CP50-2 with and opening angle of 2°, at 25° C. and a shear rate of 1 $s^{-1}$.

Preferably the silicone composition is an addition-crosslinking silicone composition and comprises the following components:
(A) an organic compound or an organosilicon compound, containing at least two radicals having aliphatic carbon-carbon multiple bonds,
(B) an organosilicon compound containing at least two Si-bonded hydrogen atoms, or instead of (A) and/or (B) or in addition to (A) and (B)
(C) an organosilicon compound containing SiC-bonded radicals having aliphatic carbon-carbon multiple bonds, and Si-bonded hydrogen atoms, and
(D) a hydrosilylation catalyst.

Preferably the addition-crosslinking silicone composition comprises the following further component:
(E) one or more fillers selected from the group consisting of fumed or precipitated silica having a BET surface area of at least 50 $m^2/g$, carbon black, activated carbon, graphite, graphenes, diamond, carbon nanotubes, aluminium nitride, aluminium oxide, barium titanate, beryllium oxide, boron nitride, magnesium oxide, particulate metal, silicon carbide, tungsten carbide, zinc oxide, titanium dioxide, ferrites, NIR absorbers, MIR absorbers, and combinations of these fillers.

The silicone layer is preferably a dielectric silicone layer or an electrically conducting silicone layer.

The silicone layer preferably has a layer thickness of 0.1 µm to 200 µm, measured by scanning electron microscope analysis.

The printing-compound carrier is preferably highly transparent to the laser beams and is selected from the group consisting of glass, vitreous silica, polyethyleneterephthalate (PET), polycarbonate (PC), polymethyl methacrylate (PMMA), and zinc selenide glass.

The deposition carrier is preferably selected from the group consisting of PET, glass, ultrathin flexible glass, and metal. In the circulation or from upstream operating steps, it is possible for crosslinked silicone layers, layers of crosslinkable silicone composition, silicone multilayer composites having at least two layers of cured silicone, and/or metallic layers to be sited on the deposition carrier.

The prior layers located on the deposition carrier are preferably a silicone film having a film thickness of 0.1 µm to 200 µm or a silicone multilayer composite having at least two layers of cured silicone each with a layer thickness of 0.1 µm to 200 µm, measured in each case by scanning electron microscope analysis.

Preferably the transferred silicone composition is laminated with a silicone film having a film thickness of 0.1 µm to 200 µm or with a silicone multilayer composite having at least two layers of cured silicone each with a layer thickness of 0.1 µm to 200 µm, in each case measured by scanning electron microscope analysis.

Preferably the silicone film, which is laminated on or which is laid ready on the deposition carrier, is obtained by detachment from a film carrier, the detachment comprising the following steps:
  immersing the film carrier with the silicone film located thereon into a liquid bath and/or spraying the inside of the film carrier already detached from the silicone film with liquid by means of a spraying unit in the direction of silicone film not yet detached; and
  detaching the silicone film from the film carrier.

The detached silicone film is preferably tested for damage by a regulated perforation tester. Ionization voltages used here are in the range from 100 to 40,000 V, preferably 2000 to 20,000 V.

Preferably one or more further silicone layers are applied to the transferred silicone composition, by repetition of steps (i) to (vi) of the above-stated laser transfer printing method.

Preferably the deposition carrier is configured as a moving carrier belt which is supplied from a deposition carrier roll (2) and after coating is collected in a storage roll (18a).

In an alternative embodiment, the deposition carrier is configured as a moving circulating belt and is circulated via a belt store (18b) until the coating with one or more silicone layers and optionally lamination with further films is concluded.

The laser source is preferably set up to roughen, ablate, structure and/or cut the deposition carrier or the silicone layers applied thereon.

The method of the invention can be used for producing composite electrodes.

The silicone layer is preferably an electrically conducting silicone layer and the method preferably comprises the following steps:
  providing a dielectric layer, preferably a dielectric silicone layer, applying an electrically conducting metal layer to the dielectric layer;

applying the electrically conducting silicone layer to the electrically conducting metal layer;

applying a further electrically conducting metal layer to the electrically conducting silicone layer;

applying a further dielectric layer, preferably a dielectric silicone layer, to the further electrically conducting metal layer.

Preferably the dielectric layers each have a layer thickness of 5 µm to 100 µm, the electrically conducting metal layers each have a layer thickness of 0.01 µm to 5 µm and the electrically conducting silicone layer has a layer thickness of 5 µm to 100 µm, measured by scanning electron microscope analysis.

Preferably the printing-composition carrier resulting from step (v) with non-transferred, crosslinkable silicone composition is coated again completely with crosslinkable silicone composition and used for the application of one or more further silicone layers by laser transfer printing.

The complete coating preferably comprises the following steps:

detaching the non-transferred silicone composition from the printing-composition carrier by means of a carry-off system (this also embraces the detachment of the remaining, non-crosslinked and/or crosslinked silicone compositions from the regions of previously transferred silicone compositions);

processing the detached silicone composition in a processing system; and carrying the processed silicone composition onto the printing-compound carrier by means of a carry-on system.

Common laser transfer printing processes (LIFT=Laser Induced Forward Transfer) are adequately described in the literature and are prior art.

In the case of use with silicone compositions, extending the method with a defined charging and with the additional use of electrostatic fields has proved to be advantageous (EF LIFT=Electric Field Laser Induced Forward Transfer).

In the text below, a number of embodiments of the invention are described by way of example with reference to FIGS. 1 to 6. They should not, however, be understood as conclusive as regards the forms of configuration of the present invention.

Figure 3:
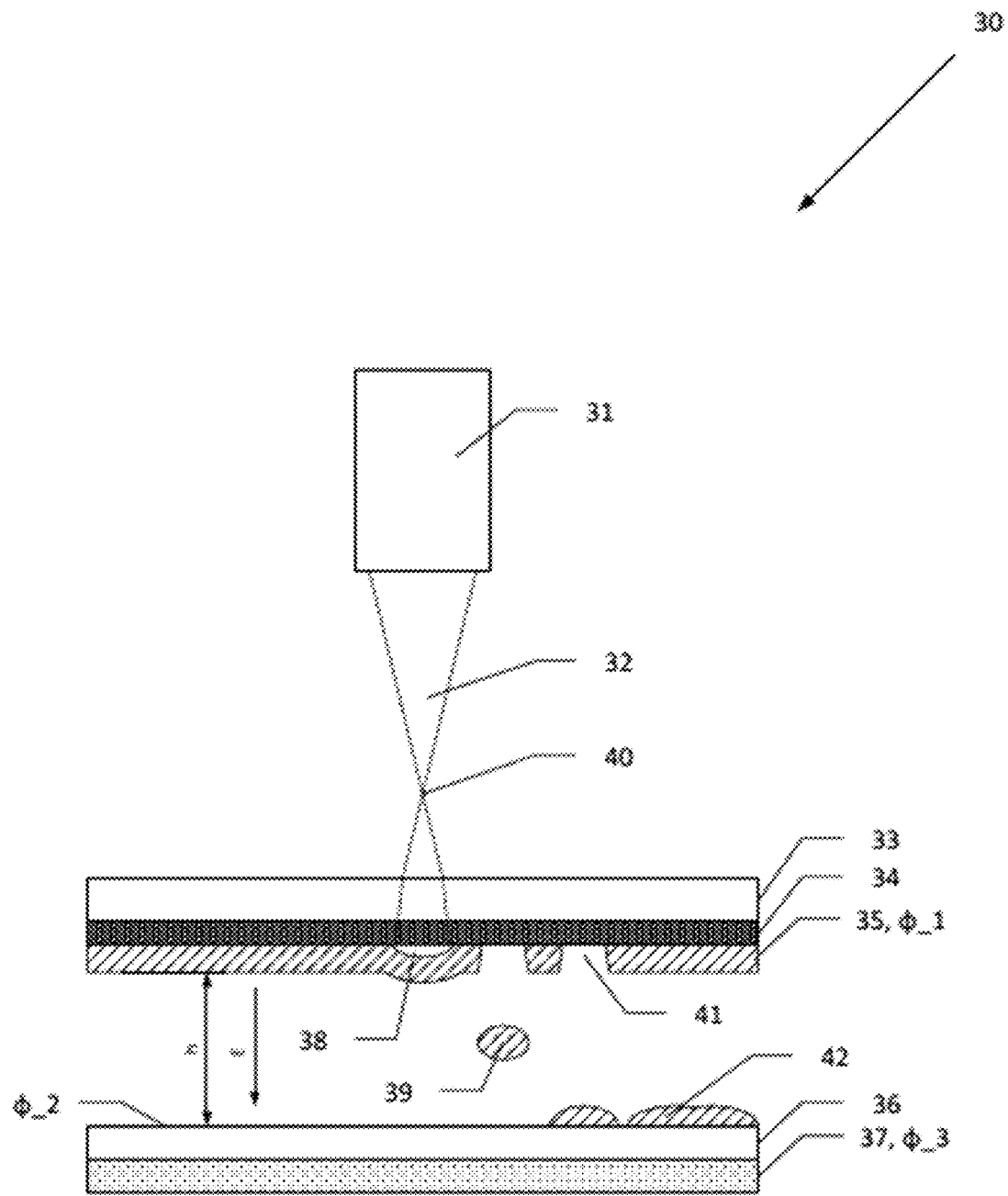
FIG. 3 shows a diagram of the laser transfer operation.

FIG. 3 depicts an EF LIFT process of this kind with the diagram (30). In this case a laser source (31) is used to detach a silicone composition (35) via a laser beam (32) from a printing-compound carrier (33) which is transparent to laser radiation. Detachment takes place in the detachment region (38). Here, the laser beam (32) induces heating which gives rise to the formation of gas (e.g. by evaporation, sublimation or decomposition of at least one component present in the silicone composition (35)). In a further embodiment, the transfer of laser radiation into heat may be performed by an additional opaque detachment layer (34). This is particularly advantageous in the case of optically transparent silicone elastomers. In typical LIFT processes, the detachment of the silicone composition (35) is sufficient to place detached printing compounds (39) onto a deposition carrier (36). In the particular case of the LIFT process with silicone elastomers, an improvement in this detachment and placement can be achieved with additional charging of the printing compound and of the carrier region. In that case the silicone composition (35) is charged with the electrical potential (phi_1), the surface of the deposition carrier (36) with the electrical potential (phi_2), and the electrode (37) with the electrical potential (phi_3). The polarity of these potentials should be chosen so as to produce an opposite charge. The charges of the layers at the distance (h) from one another gives rise to electrical fields (E). These in turn produce forces in the direction of the deposition carrier (36) onto the silicone composition (35). Hence a detached printing compound (39) is accelerated by the electrostatic forces and moved in the direction of the deposition carrier (36). During detachment and on impingement, the detached silicone composition (39) is subjected to significant mechanical shearing forces. An advantageous composition of material (e.g. shear-thinning silicones) is advantageous here for the formation of an impervious layer (42).

The shear-thinning behaviour of silicone compositions is described for example in WO 2017/081028 A1 in connection with ballistic printing processes.

Additionally, the electrostatic forces of the remaining charges in the placed layer (42) act in the direction of the electrode (37). Charging of the deposition carrier (36) on the surface with the potential (phi_2) proves advantageous for the relaxation, at lower levels than the charge quantity of the placed silicone composition (39). A remaining charge of the material (42) should be chosen so that the effect on the fields (E) is as small as possible, and yet relaxation of the layer (42) is improved or accelerated.

In many versions of the known LIFT process, there are references to the focussing of the laser beam onto the interface between the printing compound and the printing-compound carrier (33). In the version with silicones, focussing above the printing-compound carrier results in a better printing pattern. The focal point (40) here is in the range of a few micrometres to a few millimetres above the printing-compound carrier (33). Focussing the laser beam on, within or under the interface first produces a detachment of the silicone composition (39), but this leads subsequently to considerable secondary heating on the deposition carrier (36) and hence to the burning or thermal degeneration of the applied silicone composition (42).

Customary laser sources (31) are, for example, Nd:YAG lasers (neodymium-doped yttrium aluminium garnet lasers), which emit laser radiation in the NIR range (near infrared, around 0.78 to 3 µm). With the majority of laser systems, these wavelengths are used for coupling into opaque media such as metals. In the application described in the invention, it is advantageous to use carrier material such as glass, vitreous silica, polyethylene terephthalate (PET), polycarbonate (PC), polymethyl methacrylate (PMMA), etc., for the printing-compound carrier (33). In the case of transparent silicones, the presence of an opaque coating (34) or of absorbing additives is necessary in the silicone composition, such as carbon black, graphites, graphenes, carbon nanotubes (CNTs), for example. Electrically non-conducting absorbers are available commercially, for example, from FEW Chemicals GmbH, Germany.

A further version of the EF LIFT process may take the form of a change of the wavelength of the laser (31) in the MIR range (mid-infrared, around 3 to 50 µm). Customary laser sources are in this case in a wavelength range of 10.6 µm (CO2 lasers). In this specific configuration, transparent silicone elastomers can be used without additions of absorbers and without an opaque detachment layer (34) in the EF LIFT process. The printing-compound carrier (33) is in this configuration to be made optically transmitting for the relevant wavelengths. For a wavelength of 10.6 µm, preference is given here to using ZnSe glass (zinc selenide). Used in particular here are anti-reflection coatings at the interfaces of the ZnSe carriers. A customary supplier in this case is LASER COMPONENTS GmbH, Germany.

In the method of the invention, the laser has a wavelength in the range from 0.78 µm to 20 µm, more preferably in the 0.9 µm to 12 µm range, most preferably in the 0.9 µm to 1.1 µm range.

Detachment layers (34) are known to the skilled person and may consist, for example, of layers deposited by CVD (chemical vapour deposition) or PVD (physical vapour deposition), or of other opaque substances. This layer may preferably be attached to the printing-compound carrier (33) such that on heating by the laser (31) there is no detachment of the detachment layer (34) from the printing-compound carrier (33).

Figure 4:
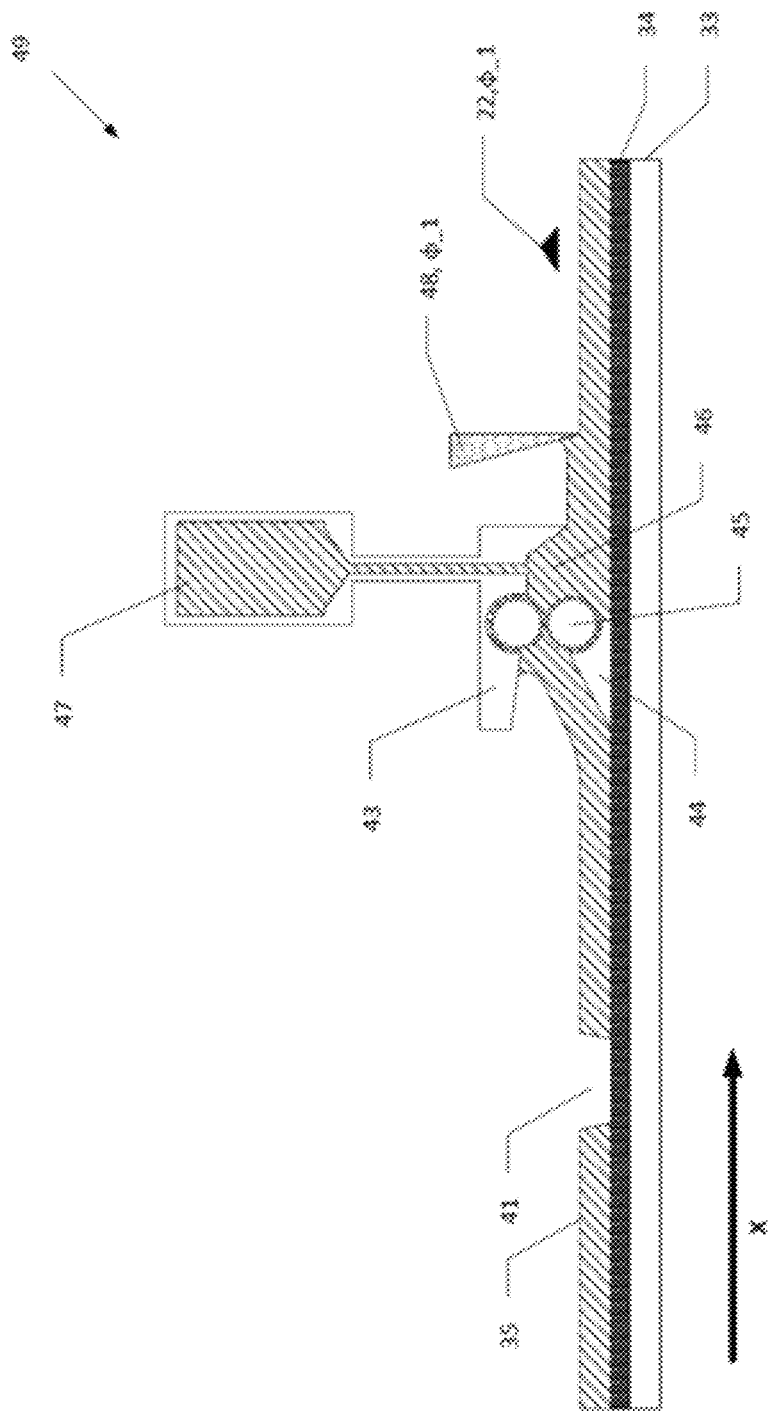
FIG. 4 shows a diagram relating to the application of a silicone composition to a printing-compound carrier suitable for laser transfer printing.

In FIG. 4, in the process diagram (49), the application system for the printing compounds (35) is depicted. In this case the non-transferred printing compound (35) is detached by a carry-off and carry-on system (43) from the printing-compound carrier (33) and/or from the detachment layer (34), which is coated again over its full area with printing compound. The carry-off unit (44) pulls the non-transferred printing compound (35) and partly undetached printing compound into the regions (41) from the printing-compound carrier (33, 34). The printing-compound carrier here moves in a positive X-direction towards the detachment unit. PTFE strippers and removing edges made from a soft material have proved to be advantageous as carry-off unit (44). The old printing compound detached is transported off by a processing unit (45) from the carry-off unit (44), mixed, and subjected to defined mechanical shearing. Shear rates occurring should be chosen preferably in the 0.1-1000 s$^{-1}$ range, more preferably in the 0.1-100 s$^{-1}$ range. Shear rates which are too high may adversely affect mixing-in and the properties of the fillers of the printing compound. Shear rates that are too low lead to poor mixing and/or to poor application of the new layer. The printing material is supplied and replenished by a supply of printing compound from a reservoir vessel (47) into the overprint region (46) of the carry-on system. The feed may take the form of a point line from the vessel (47) to the region (46), or a ring line with permanent flow of material between the two. The printing compound is preferably loaded permanently with a shear in the vessel (47) and in the region (46) by the circulation of the printing compounds between the two regions. In particular, in addition to the shearing, the vessel (47) or the entire application system is heated. In this case, printing compound carried off is reheated by the circulation of material between (47) and (46). The temperatures of material occurring are in the range from −10° C. to 150° C., more preferably in the 20° C. to 100° C. range, most preferably in the 50° C. to 80° C. range.

Supplies of material to the reservoir vessel (47) are performed by customary metering systems with venting. Such systems are available, for example, from ViscoTec Pumpen-u. Dosiertechnik GmbH, Germany.

As a result of the pressure increase and shearing in the region (46), a homogeneous silicone layer free from air bubbles is applied in a thickness of 1 to 400 µm, preferably 10 to 50 µm, more particularly 10 to 20 µm onto the printing-compound carrier. With the precision thickness remover (48), the renewed layer (35) of printing compound is again narrowed down to a layer thickness deviation +/−5% and can optionally be charged with an electrical potential (phi_1). In this case the precision thickness remover is electrically conducting. Preference is given to the use here of at least one lapped precision doctor blade made of hardened metal. Particular preference is given here to the use of doctor blades/materials which exhibit no ablation of material, are resistant to corrosion and to solvents, and are approved in medical applications.

In a further form, the charging of the printing compound to the potential (phi_1) may be accomplished contactlessly by ionization (22). This may take place individually or in combination with the charging at the thickness remover (48). Customary regulated ionization systems are known to the skilled person and available for example from Simco-Ion, The Netherlands.

FIG. 1 illustrates a roll-to-roll process for producing multilayer silicone elastomer systems, with various embodiments.

In the process diagram (1), the rolls (2) and (3), consisting of an unstretchable carrier belt (36), feed the process (1) with an ultrathin electroactive film (55) of elastomer or elastomer laminate (14), located optionally on said belt (36), and optionally with a laminating film (4). The laminating film (4) is removed during the unwind procedure.

According to the principle (30), the coating systems (5) and (6) bring printing compounds (electrode material and/or electrically non-conducting material) in non-crosslinked form onto the deposition carrier (36) or a laminate (14). The geometric form of the layers to be applied may be varied according to requirements. An active camera system (16) can be used to ensure the geometrically defined positioning of these layers. In that case the camera system (16) verifies the shape and also the position of the layers already applied in the laminate (14). A superordinate control and regulation unit controls and positions the coating systems (5) and (6) in accordance with the information from the camera system (16) and also with further regulating variables such as, for example, web speed, or set electrical potentials such as phi_1, phi_2 and phi_3, for example.

The layers applied are subsequently laminated with a film (55) of elastomer, which is detached from the film carrier (19) in the delamination unit (7).

Figure 5:
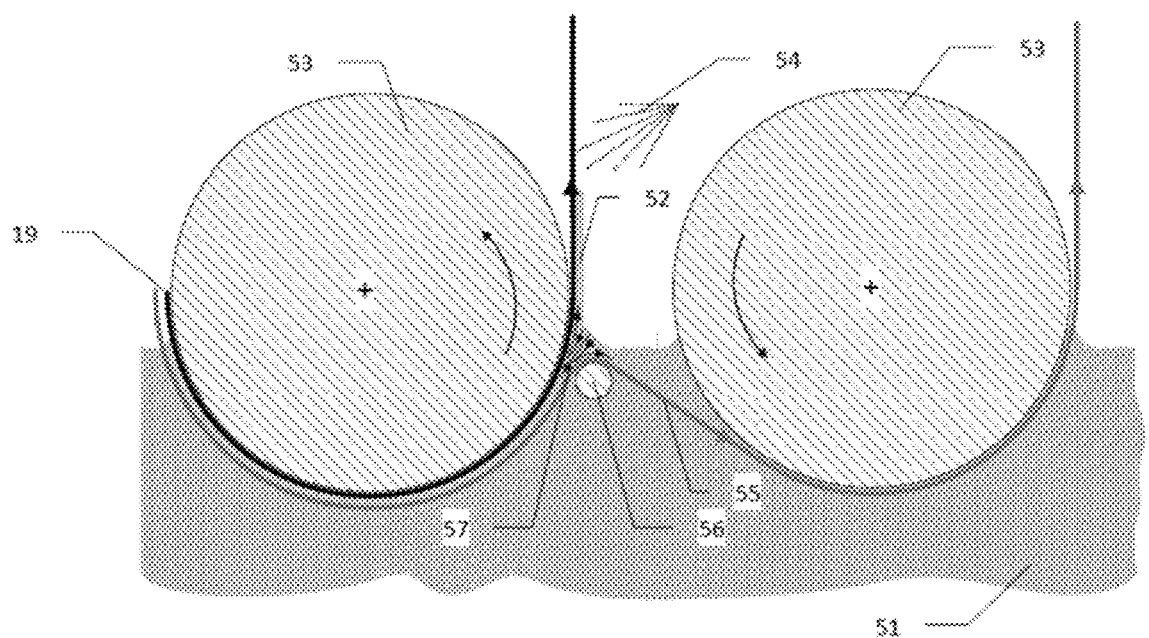
FIG. 5 shows a diagram of the mechanism for detachment of a silicone film from a film carrier, using liquids.

FIG. 5, in the detailed view (50), shows a gentle and defect-free detachment mechanism for ultrathin elastomer film (preferably 1 to 200 µm). The ultrathin film (55) of elastomer is detached continuously from the unstretchable film carrier belt (19), preferably in immersion in a liquid bath (51) or under the influence of liquid wetting (52), generated in particular by a spraying unit (54). The free film carrier belt (19) is subsequently collected on a winding unit (9).

The principle of the gentle detachment of the film of elastomer is based on the reduction of chemical and physical adhesion as a result of the presence of a liquid hydrophilic interlayer (57) in the region of the detachment of the hydrophobic film of elastomer and film carrier. On detachment, the liquid interface in the bath forms a contact line on the film carrier, which exerts a capillary-induced removal force at the margin of the film (55) of elastomer. The apparatus may optionally include a positionally adjustable guide roll (56) which defines a detachment angle between film of elastomer and film carrier.

Where the film carrier (19) is pretreated with, for example, a release agent component which is soluble in the liquid (51) in the bath (8), the detachment force required can here be deliberately reduced, between the fully crosslinked film of elastomer and film carrier, by the dissolution of this layer in the liquid tank. An additional advantage of the detachment mechanism of the invention is that, in the presence of a layer of liquid, the electrostatic charges are neutralized and also dirt particles adhering are continuously removed. The drops of liquid adhering on the film (55) of elastomer are removed subsequently by the air jet unit (10)—for example air rolls, air jets or fans—from the film (55) of elastomer.

The rotational speeds of the rolls (53) may optionally be different, in order thereby to bring about defined preliminary stretching of the free film (55) of elastomer.

In the case of the liquid-assisted detachment of the elastomer film, carried out with ultra-pure water in particular, support may be provided by the addition of surface-active additives (e.g. surfactants). General surface modifications of the film carrier (19) may minimize adhesion forces here and so improve the detachment process. Common ways and methods are known in the prior art.

By means of the discharging facility (20) the deposition carrier (36), after unrolling from the deposition carrier roll (2), along with all the silicone materials, silicone layers and/or laminates (14) located thereon, is discharged.

Contactless charging (21) charges the deposition carrier surface (that surface of the deposition carrier (36) that is to be printed) to the potential (phi_2). The deposition carrier surface here is the topmost area to which printing is to take place with the printing systems (5) and (6).

In the printing systems, the printing compound is charged to potential (phi_1). Located beneath the printing systems (5) and (6), directly following the deposition carrier (36), is the field electrode (37) at potential (phi_3).

By means of the discharging facility (20) the deposition carrier (36), along with all the silicone materials, silicone layers and/or laminates (14) located thereon, is discharged. The charging unit (23) charges the uppermost layer and/or applied printing compound (42) on the deposition carrier (36) in a defined way to the potential (A).

By means of the charging facility (25), the free elastomer film (55) is charged locally to the potential (B) on the side facing the applied printing compound (42). The potentials (A) and (B) differ in their polarity and have the effect of attraction and adhesion when the film (55) of silicone is deposited on the printing compounds (42).

The operation of electrostatic lamination is known in the prior art and is used across a very wide variety of lamination procedures. The roll (11) sets the deposition angle and any mechanical pressure that may be necessary for the deposition and to the laminate (14). The laminate (14) thus generated is guided through a field unit (26) in which magnetic and/or electrical fields influence the uncured silicone layers. This may generate arbitrarily variable effects in the elastomer layers, from inductive heating up to alignment of magnetic fillers. The laminate is crosslinked in the curing station (12). In the cooling station (13), the laminate is cooled. The cured and cooled laminate is then collected (rolled up), with insertion of a laminating film (4), on the roll (18a).

For error detection, a perforation tester (24) performs contactless testing of the freely suspended elastomer film (55) for damage and weak points. After the testing, discharging is carried out by a discharging facility (20). Weak points or defects are recognized by electrical breakdown and are signalled by the perforation tester (24).

The arc which occurs at the defects causes burning and a recognizable coloration or alteration at the breakdown sites. Defects which have been recognized and signalled are evaluated in a superordinate control and regulation unit and are assigned and, optionally, marked according to the web position. Regions beneath and surrounding the defect are recorded in the software of the control and regulation unit and are later declared as rejects.

In a separate form, the position of the defect is recorded and, during a subsequent, new printing and/or lamination process, the defect surface is removed by a laser and is filled in again with insulating silicone elastomer by the printing unit (6).

Critical issues such as detachment and detachment angle, pre-tension, stretching, deposition angle, and air inclusions are of considerable influence here on the precision and the function of the subsequent EAP systems. For example, a less-than-ideal deposition of the film, and also possible air inclusions during application of an additional layer, result in subsequent blistering during the curing operation.

Simple mechanical detachment causes partial or complete damage to the film of silicone. On subsequent use in EAP systems, this leads to electrical breakdowns and component failure.

As a result of any dry detachment of the film from the film carrier, spikes are formed, and the film is partially over-stretched, and receives cracks or holes. These partial excessive exposures occur in the case of all removal processes in air. Only with detachment using a film of water is the adhesive force and therefore the mechanical loading of the silicone film reduced to an extent which allows damage to be avoided. Removal under water, or simply wetting of the removal edge, results in a considerable reduction in the adhesion force and in a reduction in the mechanical loading of the film.

Figure 2:
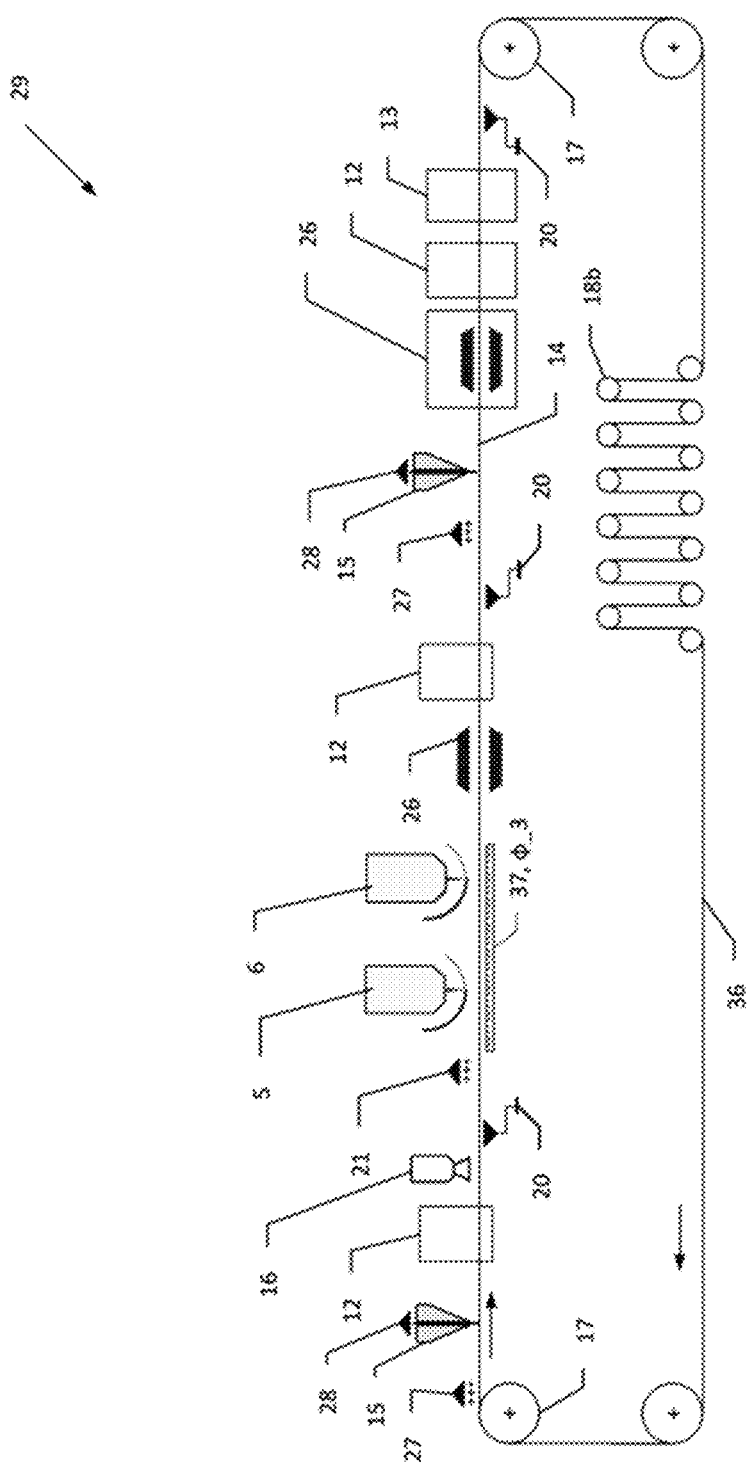
FIG. 2 shows a process diagram for the production of multilayer silicone elastomer systems, using a circulating belt.

Indicated in FIG. 2 is a particular embodiment of the process with the process diagram (29). In this case, rather than the application/lamination of a cured silicone layer, it is instead applied in a wet process by application systems. A feature of the process is that the aforementioned deposition carrier (36) is implemented in the form of an unstretchable circulating belt. This circulating belt may already carry a plurality of layers of silicone elastomers. The electrically neutral layer on the circulating belt is taken out from the loop store (18b) and charged by the charging unit (27) to the potential (C). The applicator (15) deposits a silicone layer over the full area on the deposition carrier and on the layers located thereon. The charging unit (28) charges the silicone material of the applicator (15) to the potential (D). The potentials (C) and (D) differ in their polarity and so produce electrostatic forces. The process of application is supported in this case by the effect of the electrostatic forces. After the deposition or application of a layer by the applicator (15), a curing station (12) performs partial to complete curing of the applied layer. By means of the discharging station (20), the deposition carrier is electrically neutralized together with all of the layers located thereon.

The printing operation (5,6) is performed again as described above, up to the curing station (12). After that there may optionally be further application of a silicone layer, as described above. The overall curing and influencing by means of fields take place subsequently in the field unit (26), curing station (12), and also the cooling in the cooling station (13).

The web guides (17) regulate the circulating belt and, respectively, the deposition carrier (36) in terms of the web position and web tension. The loop store (18b) undertakes interim storage of the necessary process quantity or batch quantity in accordance with the desired batch size. When the number of desired layers has been reached, the silicone elastomer laminate is taken off from the circulating belt. Customary take-off apparatuses are known in the art.

In one specific configuration of the process, the surface to be coated is roughened and/or ablated or structured, respectively, ahead of the EF LIFT process. Additionally, the laser system may be set up to perform singularization on the deposition carrier belt (36). In this procedure the deposition carrier belt (36) is not damaged.

An engraving laser with a 10.6 μm wavelength can be used, for example, for the cutting and targeted ablation of silicone layers. Moreover, an improvement in cutting accuracy is achievable, for example, with a 9.3 μm laser. The installation of different laser sources (e.g. wavelength: 1.06 μm and 10.6 μm) is therefore suitable for the system to be used for cutting and for the LIFT printing.

Figure 6:
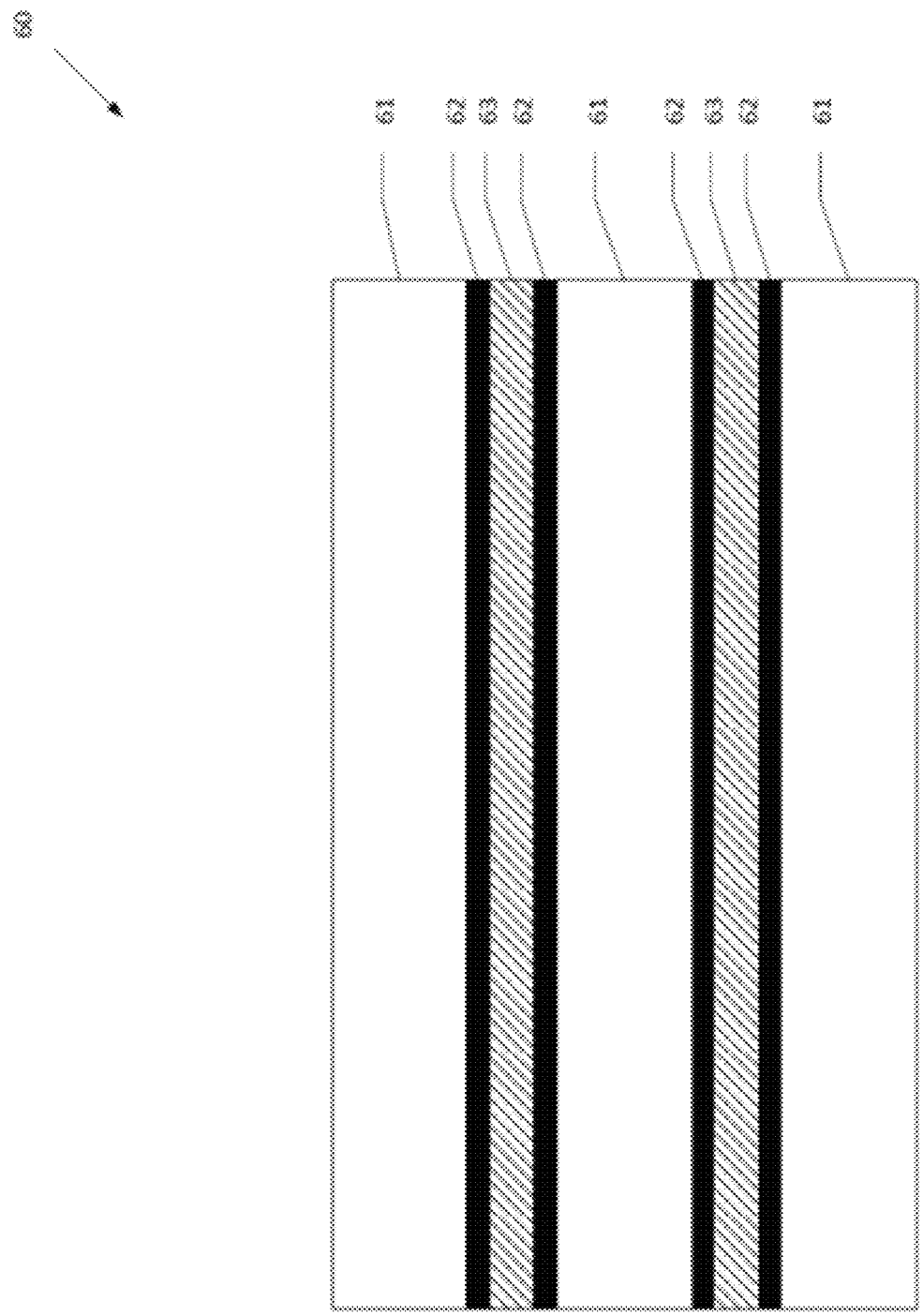
FIG. 6 shows the construction of a composite electrode.

In one specific version of the process, an electrode is constructed as a multilayer system (composite electrode). FIG. 6 shows an electrode arrangement of this kind in the form of the sectional diagram (60). A thin silicone layer (62), comprising substances of very good conductivity such as metals, CNTs, conductive carbon black, etc., is combined with a very flexible conducting layer (63) to form an electrode. In this electrode, the layer (63) takes on the function of transporting charge to the electrode charging surface (62). Highly conductive layers (62) usually lack long-term elasticity, and become fragile in the course of the plastic stressing of the EAP systems, and tend to impair charge transport, up to the entire insulation of individual regions. Separating the functions of charging surface and charge transport solves this problem.

In process terms, the application of the metallic layers can be carried out by the LIFT method and by the EF LIFT method and by further, different, methods.

Application in the method described above may be undertaken by printing belts with metal printing compounds and/or print layers. A binder component is superfluous on direct application to an uncured silicone elastomer material.

For example, the electrode surface may be formed of elastomer with a carbon black filler. In this case it must be borne in mind that the filler fraction must usually be above 50 wt %, based on the overall electrode mass, in order to obtain sufficient conductivity. On mechanical loading (tensile elongation), a deterioration in the conductivity may be observed.

All EAP systems have the physical background of charges which attract and/or repel one another. The constructions always take the form of layers, and hence the charges are to be ordered in charging areas or regions. These regions determine the effective distance between the electrodes, which is a factor in the effectiveness. The silicone layer filled with conductive material, preferably CNTs, is utilized for charge transport to the electrode surface. The electrode surface is produced by a very thin metal layer, preferably aluminium.

If the elastic conduction layer is absent from an actuator, there is increased heating of mechanically loaded regions and there are also hot spots on the degenerated electrode surface. This can be attributed to poor bonding of the layer, the formation of cracks, and a lack of elasticity. Bonding to an elastic conduction layer solves this problem.

The method of the invention is employed preferably for producing sensors, actuators or other EAP systems comprising at least two electrodes and at least one dielectric silicone layer disposed between the electrodes.

The silicone layer in this case may be an electrode layer and/or may be the dielectric layer in sensors, actuators or other EAP systems.

Examples

The EF LIFT process was carried out with a customary laser gravure system from TROTEC Laser Deutschland GmbH. The system employed here is a Speedy 100flexx 60/20 system with dual laser source (60 W 10.6 μm CO2 laser; 20 W 1.06 μm fibre laser). Used as the carrier and printing-compound carrier are customary vitreous silica plates (300×300×3 mm) from GVB GmbH Solution in Glas, Germany. The film of printing compound is applied using a ZAA2300 automatic film-drawing unit with a ZUA 2000 universal applicator from Zehntner GmbH, Switzerland. The printing compound used is an RTV-2 silicone with 0.5 m % CNTs and 5 m % conductive carbon black with the PT15 crosslinker from WACKER Chemie AG, Germany.

The doctor system knife-coats one side of a vitreous silica sheet centrally with a homogeneous layer in a thickness of 60 μm and in dimensions of 200×200 mm. The marginal regions of the sheet remain free from printing compound. An uncoated and cleaned sheet is inserted, as the surface for printing, into the cutting chamber of the laser. The coated sheet is placed at a distance of 200 μm from the first sheet, facing the uncoated sheet with its side bearing the coating. The distance is adjusted here by means of spacers such as, for example, 100 μm microscope slides. The print original selected in the control software of the laser system is a two-dimensionally filled geometry without grey regions and shading. Further, the laser power in the fibre laser cutting mode of between 40-60% is sufficient in the case of a 20 W laser. The laser speed selected is between 50% and 70%. The focal point ought to lie at around 4 to 4.5 mm above the interface between the coating and the vitreous silica plate. In this way, the chosen geometries were successfully transferred by the laser.

In a further embodiment, a silicone film (ELASTOSIL® film 100 μm thick, available from WACKER Chemie AG) is fixed by a film of water on the uncoated glass sheet. The topside of the silicone film is subsequently charged to −300 V by a charging system from Simco-Ion, consisting of a CM LITE high-voltage charging unit with HDR charging electrode. The charging is measured using the SK050 electrostatic meter, and verified using the SK1000 evaluation unit, from Keyence. A comparable charging to +100 V is carried out with the printing-compound layer. Both plates are subsequently placed again in the cutting chamber of the laser. The distance between the printing compound and the silicone film can be selected, using spacers, in the 100 to 400 μm range. The LIFT operation is to be carried out comparable with the description above. Without the stated charging, detached printing compounds are transferred incompletely and/or untargettedly. Moreover, the charging produces more uniform deposition and a better integration of the transferred layers.

REFERENCE SYMBOLS IN THE FIGURES

1 Process diagram process 1
2 Deposition carrier roll
3 Film carrier roll
4 Laminating film
5 Coating system for electrode material
6 Coating system for electrically insulating material
7 Film delamination unit (elastomer—carrier)
8 Liquid tank/wetting
9 Winding unit for carrier film
10 Air jet unit (removing drops/liquid from elastomer film)
11 Laminating rolls
12 Curing station
13 Cooling station
14 Laminate (at least carrier; elastomer; electrode; elastomer)

15 Applicator
16 Active camera system
17 Web guide circulating belt
18a Storage roll
18b Belt store
19 Film carrier
20 Electrostatic discharging
21 Charging to potential ϕ_2
22 Charging to potential ϕ_1
23 Charging to potential A
24 Perforation test
25 Charging to potential B
26 Field unit (electrical fields, magnetic fields)
27 Charging to potential C
28 Charging coating to potential D
29 Process diagram process 2
30 Diagram EF LIFT
31 Laser source
32 Laser beam
33 Printing-compound carrier
34 Detachment layer
35 Silicone composition/electrode material/printing compound/support material
36 Deposition carrier with or without silicone elastomer film or laminate
37 Field electrode EF LIFT
38 Detachment region
39 Detached printing compound/electrode material
40 Focal point of laser beam
41 Empty region carrier/region of detached printing compound
42 Applied printing compound/print layer applicator
43 Carry-off and carry-on system
44 Carry-off system for printing compound not transferred
45 Processing and shearing of printing compounds
46 Overprint region, application printing compound
47 Reservoir vessel
48 Precision thickness remover and charging edge
49 Process diagram applicator printing layer
50 Detailed diagram detachment mechanism liquid detachment
51 Liquid
52 Film of liquid
53 Rotating rolls
54 Liquid spraying unit
55 Elastomer film
56 Guide roll
57 Induced force (peeling)—liquid meniscus
60 Sectional diagram composite electrode
61 EAP layer (non-conducting silicone elastomer)
62 Electrode charging surface
63 Conduction layer

The invention claimed is:

1. A method for applying at least one silicone layer by laser transfer printing, the method comprising the following steps:
   (i) providing a laser source;
   (ii) providing a printing-composition carrier beneath the laser source, the printing-composition carrier being transparent to laser radiation and being coated on the lower side with a crosslinkable silicone composition, and at least the surface of the crosslinkable silicone composition being charged to a potential phi_1;
   (iii) providing a deposition carrier beneath the printing-composition carrier;
   (iv) providing an electrode beneath the deposition carrier, the electrode being charged to a potential phi_3, where phi_1 and phi_3 have opposite polarities;
   (v) irradiating the printing-composition carrier with laser beams, so that at least a part of the crosslinkable silicone composition is detached and is transferred to the deposition carrier; and
   (vi) forming a silicone layer by completely or partly crosslinking the silicone composition transferred to the deposition carrier.

2. The method according to claim 1, wherein at least the surface of the deposition carrier that is facing the crosslinkable silicone composition is charged to a potential phi_2, where phi_2 and phi_1 have opposite polarities and phi_2 is chosen such that at least a part of the charge quantity of the silicone composition transferred in step (v) to the deposition carrier is neutralized on the surface of the deposition carrier.

3. The method according to claim 2, wherein disposed between the printing-composition carrier and the silicone composition, is an opaque detachment layer which heats up on irradiation with laser beams.

4. The method of claim 2, wherein a focal point of the laser beams is located above the printing-composition carrier.

5. The method claim 2, wherein the silicone composition has a dynamic viscosity of 10 mPa·s or more and 1000 Pa·s or less, measured according to DIN EN ISO 3219: 1994 and DIN 53019 by a calibrated rheometer having a cone-plate system, cone CP50-2 with an opening angle of 2°, at 25° C. and a shear rate of $1s^{-1}$.

6. The method of claim 2, wherein the silicone composition is an addition-crosslinking silicone composition and comprises the following components:
   (A) an organic composition or an organosilicon composition, containing at least two radicals having aliphatic carbon-carbon multiple bonds,
   (B) an organosilicon composition containing at least two Si-bonded hydrogen atoms, or instead of (A) and/or (B) or in addition to (A) and (B)
   (C) an organosilicon composition containing SiC-bonded radicals having aliphatic carbon- carbon multiple bonds, and Si-bonded hydrogen atoms, and
   (D) a hydrosilylation catalyst.

7. The method of claim 6, wherein the addition-crosslinking silicone composition further comprises: (E) one or more fillers selected from the group consisting of fumed or precipitated silica having a Brunauer-Emmett-Teller (BET) surface area of at least 50 $m^2$/g, carbon black, activated carbon, graphite, graphenes, diamond, carbon nanotubes, aluminium nitride, aluminium oxide, barium titanate, beryllium oxide, boron nitride, magnesium oxide, particulate metal, silicon carbide, tungsten carbide, zinc oxide, titanium dioxide, ferrites, Near-Infrared (NIRI absorbers, Mid-Infrared (MIR) absorbers, and combinations of these fillers.

8. The method of claim 2, wherein the silicone layer is a dielectric silicone layer or an electrically conducting silicone layer.

9. The method of claim 2, wherein the silicone layer has a layer thickness of 0.1 μm to 200 μm, measured by scanning electron microscope analysis.

10. The method of claim 2, wherein the printing- composition carrier is selected from the group consisting of glass, vitreous silica, polyethylene terephthalate (PET), polycarbonate, polymethyl methacrylate (PMMA), and zinc selenide glass.

11. The method of claim 2, wherein the deposition carrier is selected from the group consisting of polyethylene terephthalate (PET) film, metal foil, and glass.

12. The method of claim 2, wherein the deposition carrier additionally bears one or more of the following: one or more crosslinked silicone layers, one or more layers of crosslinkable silicone composition, silicone multilayer composites having at least two layers of cured silicone, and/or metallic layers.

13. The method of claim 12, wherein the thickness of the individual layers is 0.1 µm or more to 200 µm or less, measured by scanning electron microscope analysis.

14. The method of claim 2, wherein the transferred silicone composition is laminated with a silicone film having a film thickness of 0.1 µm to 200 µm or with a silicone multilayer composite having at least two layers of cured silicone each with a layer thickness of 0.1 µm to 200 µm, measured by scanning electron microscope analysis.

15. The method of claim 14, wherein the silicone film is obtained by detachment from a film carrier, the detachment comprising the following steps:
immersing the silicone film applied on carrier film into a liquid bath and/or spraying the inside of carrier film already detached from the silicone film with liquid by means of a spraying unit in the direction of silicone film not yet detached; and
detaching the silicone film from the laminating film.

16. The method of claim 15, wherein the detached silicone film is tested for weak points by regulated perforation testers.

17. The method of claim 2, wherein one or more further silicone layers are applied to the transferred silicone composition by repetition of steps (i) to (vi).

18. The method of claim 2, wherein the deposition carrier is configured as a moving carrier belt which is supplied from a deposition carrier roll and after coating is collected in a storage roll.

19. The method of claim 2, wherein the deposition carrier is configured as a moving circulating belt and is circulated via a belt store until the coating with one or more silicone layers is concluded.

20. The method of claim 2, wherein the laser source is configured to roughen, ablate, structure and/or cut the surface of the deposition carrier or of the silicone layer applied thereon.

21. The method of claim 2, wherein the silicone layer is an electrically conducting silicone layer and the method comprises the following steps:
providing a dielectric layer;
applying an electrically conducting metal layer to the dielectric layer;
applying the electrically conducting silicone layer to the electrically conducting metal layer;
applying a further electrically conducting metal layer to the electrically conducting silicone layer; and
applying a further dielectric layer to the further electrically conducting metal layer.

22. The method of claim 21, wherein the dielectric layers each have a layer thickness of 5 µm to 200 µm, the electrically conducting metal layers each have a layer thickness of 10 nm to 100 µm, and the electrically conducting silicone layer has a layer thickness of 5 µm to 200 µm, measured by scanning electron microscope analysis.

23. The method of claim 2, wherein the printing-composition carrier resulting from step (v) with non-transferred, crosslinkable silicone composition is coated again completely with crosslinkable silicone composition and used for the application of one or more further silicone layers by laser transfer printing.

24. The method of claim 23, wherein the complete coating comprises the following steps:
detaching the non-transferred silicone composition from the printing-composition carrier by means of a carry-off system;
processing the detached silicone composition in a processing system; and
carrying the processed silicone composition onto the printing-composition carrier by means of a carry-on system.

25. The method of claim 2, wherein the method produces sensors, actuators, or electroactive polymer (EAPI layer systems.

26. The method of claim 25, wherein the silicone layer serves as an electrode layer and/or as a dielectric layer in the sensors, actuators or electroactive polymer (EAPI layer systems.

* * * * *

UNITED STATES PATENT AND TRADEMARK OFFICE
CERTIFICATE OF CORRECTION

PATENT NO. : 11,903,320 B2
APPLICATION NO. : 17/041249
DATED : February 13, 2024
INVENTOR(S) : Klaus Eller et al.

It is certified that error appears in the above-identified patent and that said Letters Patent is hereby corrected as shown below:

In the Claims

Column 28, Line 38, Claim 25:
After "electroactive polymer"
Delete "(EAPI" and
Insert -- (EAP). --

Column 28, Line 41, Claim 26:
After "electroactive polymer"
Delete "(EAPI" and
Insert -- (EAP). --

Signed and Sealed this
First Day of October, 2024

Katherine Kelly Vidal
*Director of the United States Patent and Trademark Office*